United States Patent
Kuo et al.

(10) Patent No.: US 11,789,366 B2
(45) Date of Patent: *Oct. 17, 2023

(54) METHOD FOR REMOVING RESIST LAYER, AND METHOD OF MANUFACTURING SEMICONDUCTOR

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Tai-Min Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/829,366

(22) Filed: Jun. 1, 2022

(65) Prior Publication Data

US 2022/0299880 A1    Sep. 22, 2022

Related U.S. Application Data

(63) Continuation of application No. 17/035,763, filed on Sep. 29, 2020, now Pat. No. 11,378,886.

(51) Int. Cl.
*G03F 7/42* (2006.01)
*H01L 23/538* (2006.01)
(Continued)

(52) U.S. Cl.
CPC .......... *G03F 7/426* (2013.01); *H01L 21/4853* (2013.01); *H01L 21/4857* (2013.01); *H01L 21/4864* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2221/68372* (2013.01); *H01L 2224/214* (2013.01)

(58) Field of Classification Search
CPC ..... G03F 7/426; H01L 23/5386; H01L 24/19; H01L 21/4857; H01L 24/20; H01L 21/6835; H01L 21/4864; H01L 23/5383; H01L 23/5389; H01L 21/565; H01L 23/3128; H01L 21/568; H01L 21/4853; H01L 2224/214; H01L 2221/68372
USPC ........................................................ 438/126
See application file for complete search history.

(56) References Cited

U.S. PATENT DOCUMENTS 7,939,350 B2 *    5/2011    Tsai ................. H01L 21/56
                                                257/E23.116
9,000,584 B2    4/2015    Lin et al.
(Continued)

*Primary Examiner* — Vu A Vu
(74) *Attorney, Agent, or Firm* — JCIPRNET

(57) ABSTRACT

A method for removing a resist layer including the following steps is provided. A patterned resist layer on a material layer is formed. A stripping solution is applied to the patterned resist layer to dissolve the patterned resist layer without dissolving the material layer, wherein the stripping solution comprises a non-dimethyl sulfoxide solvent and an alkaline compound, the non-dimethyl sulfoxide solvent comprises an aprotic solvent and a protic solvent.

20 Claims, 24 Drawing Sheets

(51) Int. Cl.
    *H01L 23/00*     (2006.01)
    *H01L 21/683*     (2006.01)
    *H01L 21/48*     (2006.01)
    *H01L 21/56*     (2006.01)
    *H01L 23/31*     (2006.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,709,710 B2 * | 7/2017 | Kim .................. H01L 29/78633 |
| 10,859,917 B2 * | 12/2020 | Choi .................... C11D 3/0073 |
| 11,378,886 B2 * | 7/2022 | Kuo ...................... H01L 21/565 |
| 2008/0280452 A1 * | 11/2008 | Yokoi ..................... G03F 7/425 |
| | | 438/754 |
| 2012/0225510 A1 * | 9/2012 | Tsai ........................ H01L 21/56 |
| | | 257/E33.012 |
| 2019/0164907 A1 * | 5/2019 | Chen ................. H01L 23/49827 |
| 2020/0161518 A1 * | 5/2020 | Lin ..................... H01L 23/5389 |

* cited by examiner

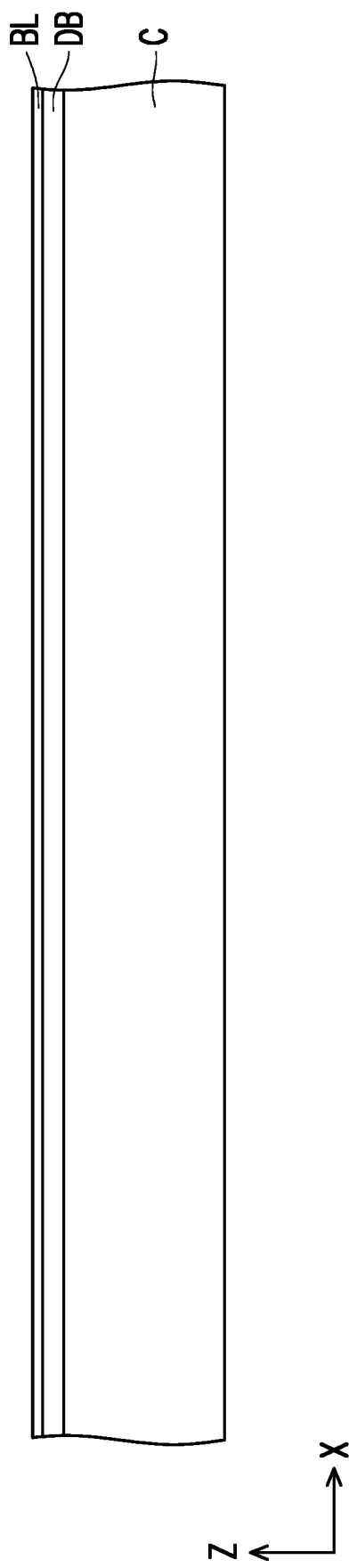

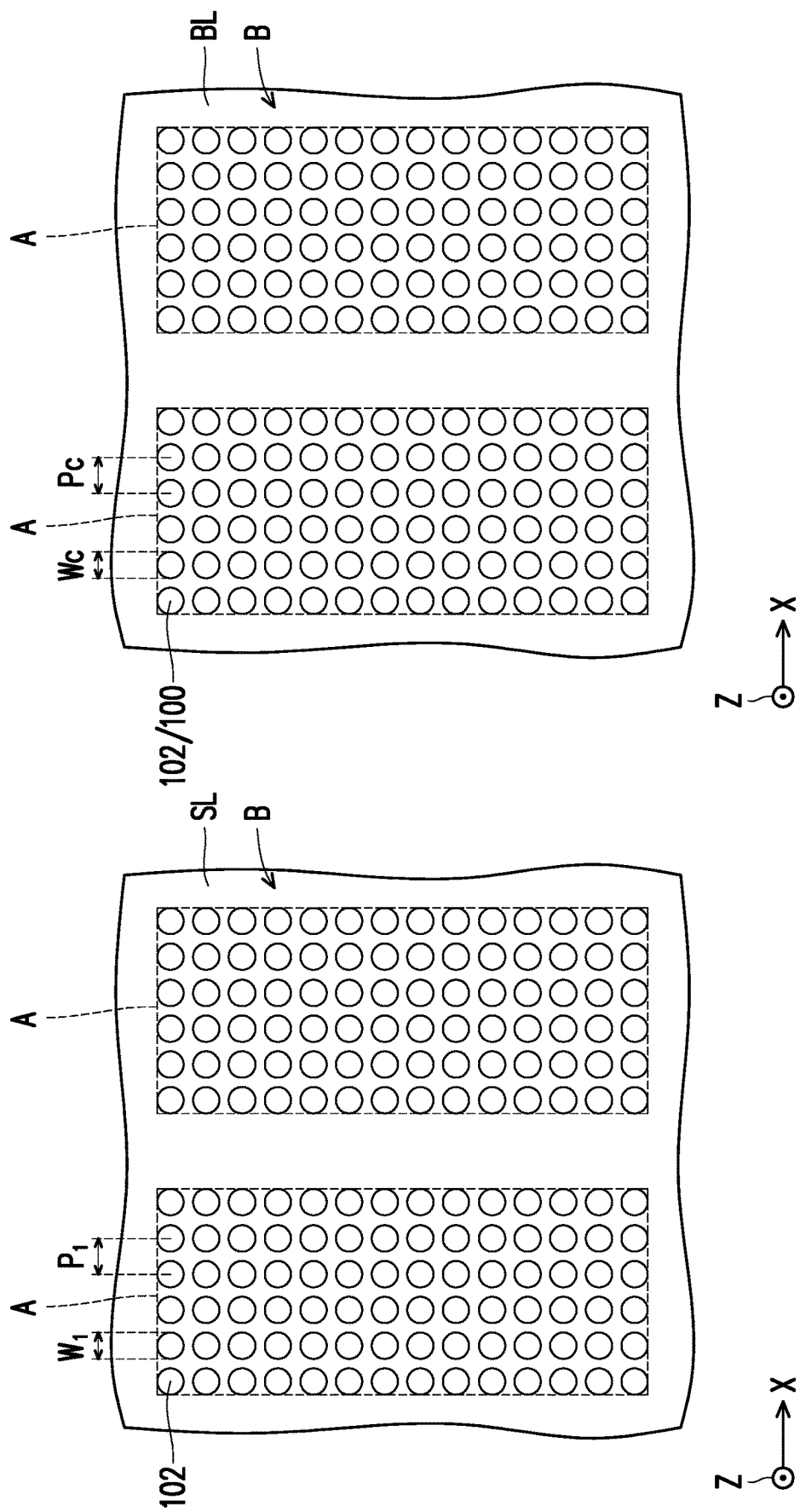

METHOD FOR REMOVING RESIST LAYER, AND METHOD OF MANUFACTURING SEMICONDUCTOR

CROSS-REFERENCE TO RELATED APPLICATION

This application is a continuation application of and claims the priority benefit of a prior application Ser. No. 17/035,763, filed on Sep. 29, 2020, now allowed. The entirety of the above-mentioned patent application is hereby incorporated by reference herein and made a part of this specification.

BACKGROUND

With the growing of semiconductor technologies, more functions need to be integrated into semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging. Currently, integrated fan-out packages are becoming increasingly popular because the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross-sectional views of various stages in a method of manufacturing a package structure in accordance with some embodiments of the disclosure.

FIG. 2A is a schematic top view illustrating a portion of the structure in the stage of FIG. 1E in accordance with some embodiments of the disclosure.

FIG. 2B is a schematic top view illustrating a portion of the structure in the stage of FIG. 1F in accordance with some embodiments of the disclosure.

DETAILED DESCRIPTION

Figure 1B:
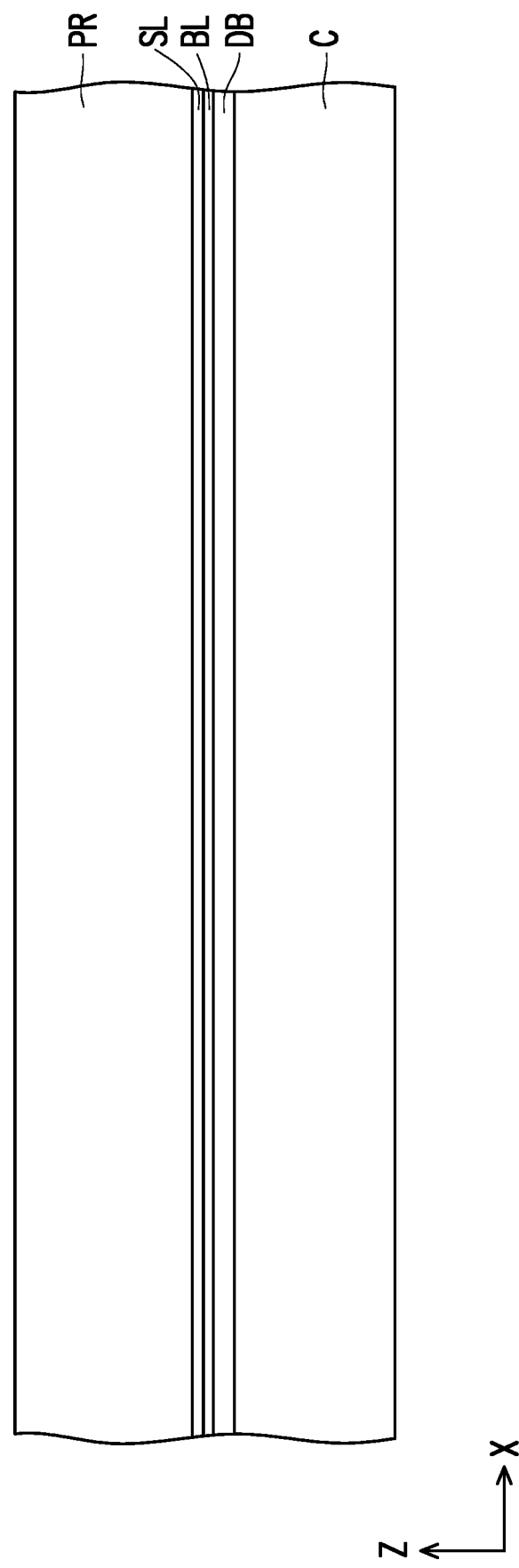

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views of various stages in a method of manufacturing a package structure in accordance with some embodiments of the disclosure.

Referring to FIG. 1A, a carrier C having a de-bonding layer DB and a buffer layer BL formed thereon is provided.

In some embodiments, the carrier C may be a glass carrier or any suitable carrier for carrying a semiconductor wafer or a reconstituted wafer for the manufacturing method of the package structure. In some embodiments, the carrier C may have a round top-view shape, and may have a size of a silicon wafer.

In some embodiments, the de-bonding layer DB is in physical contact with the illustrated top surface of the carrier C, and may be formed by a suitable fabrication technique such as coating, lamination, or deposition. In some embodiments, the material of the de-bonding layer DB may be any material suitable for bonding and de-bonding the carrier C from the above layer(s) or any wafer(s) disposed thereon. In some embodiments, the de-bonding layer DB may include a dielectric material layer made of a dielectric material including any suitable polymer-based dielectric material (such as benzocyclobutene (BCB), polybenzoxazole (PBO)). In an alternative embodiment, the de-bonding layer DB may include a dielectric material layer made of an epoxy-based thermal-release material, which loses its adhesive property when heated, such as a light-to-heat-conversion (LTHC) release coating film. In a further alternative embodiment, the de-bonding layer DB may include a dielectric material layer made of an ultra-violet (UV) glue, which loses its adhesive property when exposed to UV lights. In certain embodiments, the de-bonding layer DB may be dispensed as a liquid and cured, or may be a laminate film laminated onto the carrier C, or may be the like. In some embodiments, the illustrated top surface of the de-bonding layer DB, which is opposite to the illustrated bottom surface contacting the carrier C, may be levelled and may have a high degree of planarity, but the disclosure is not limited thereto. In certain embodiments, the de-bonding layer DB is, for example, a LTHC release layer with good chemical resistance, and such layer enables room temperature de-bonding from the carrier C by applying laser irradiation, however the disclosure is not limited thereto.

In some embodiments, the buffer layer BL is in physical contact with the illustrated top surface of the de-bonding layer DB, and the de-bonding layer DB is located between the carrier C and the buffer layer BL. In some embodiments, the buffer layer BL may be formed by a suitable fabrication technique such as coating, lamination, or deposition. In some embodiments, the buffer layer BL is, for example, polymer such as polyimide, BCB, PBO, or the like. In some alternative embodiments, the buffer layer BL may include non-organic dielectric materials such as silicon oxide, silicon nitride, silicon carbide, silicon oxynitride, or the like. It should be noted that the materials of the de-bonding layer DB, the carrier C and the buffer layer BL are merely for illustration, and the disclosure is not limited thereto. The illustrated top surface of the buffer layer BL, which is opposite to the illustrated bottom surface contacting the de-bonding layer DB, may be levelled and may have a high degree of planarity. However, the disclosure is not limited thereto; in other embodiments, the buffer layer BL may be omitted.

Referring to FIG. 1B, a seed layer SL is conformally formed on the de-bonding layer DB. In some embodiments, the seed layer SL is in physical contact with the illustrated top surface of the de-bonding layer DB. As shown in FIG. 1B, the seed layer SL is a single layer, but the disclosure is not limited thereto. In some alternative embodiments, the seed layer SL may be a composite layer formed by different materials. In some embodiments, the material of the seed layer SL may include copper, copper alloys, titanium, titanium nitride, tantalum, tantalum nitride, a combination thereof, or other suitable materials. In certain embodiments, the seed layer SL includes a titanium/copper composite layer. In some embodiments, the thickness of the seed layer SL may range from about 10 nm to about 1000 nm. In some embodiments, the seed layer SL is formed by a suitable fabrication technique such as sputtering, or physical vapor deposition (PVD).

Continued on FIG. 1B, a resist layer PR is formed on the seed layer SL. As shown in FIG. 1B, the resist layer PR is formed on the seed layer SL as a blanket layer to completely cover the seed layer SL. In some embodiments, the resist layer PR may be formed of a dry film photoresist layer, which is laminated on the seed layer SL. In some alternative embodiments, the resist layer PR may be formed of a liquid photoresist layer, which is coated on the seed layer SL. In some embodiments, the material of the resist layer PR, for example, includes a positive resist material or a negative resist material. In some embodiments, the material of the resist layer PR may include an ester group-containing resist material. In some embodiments, the resist layer PR is suitable for a subsequent patterning process such as a photolithography process with a mask (for instance, an extreme ultraviolet (EUV) lithography) or a mask-less photolithography process (for instance, an electron-beam (e-beam) writing or an ion-beam writing). In the disclosure, the resist layer PR may be referred to as a photoresist layer.

Figure 1C:
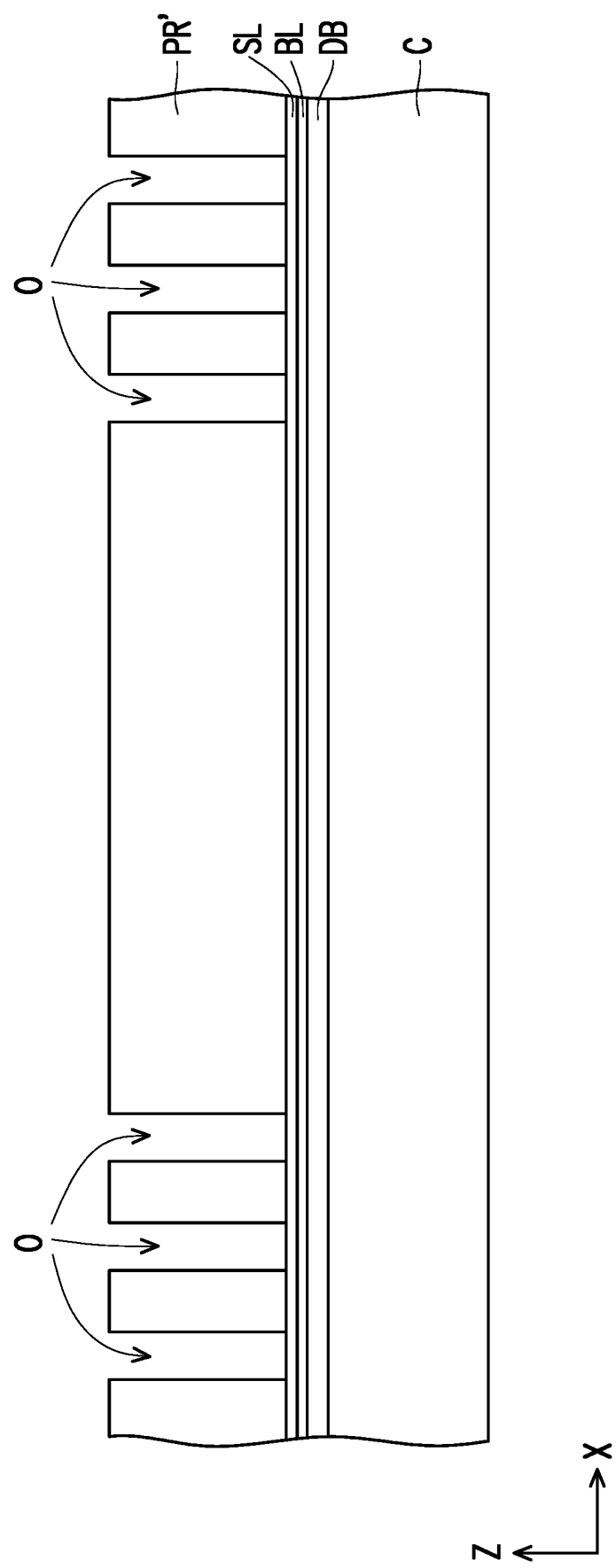

Referring to FIG. 1C, the resist layer PR is patterned to form a patterned resist layer PR' with a plurality of openings O formed therein. As shown in FIG. 1C, portions of the seed layer SL are exposed by the openings O of the patterned resist layer PR', respectively. The number of the openings O may correspond to the number of later-formed conductive structure(s) (e.g. the metal patterns 102 depicted in FIG. 1D), and thus the number of the openings O is not limited by the illustration presented in FIG. 1C. In other words, the patterned resist layer PR' may be referred to as a patterned mask layer for the later-formed conductive structure(s). In some embodiments, as mentioned above, the resist layer PR may be patterned through a photolithography process with a mask, which may include the steps of providing a photomask over the resist layer PR; globally irradiating the resist layer PR with an electromagnetic radiation through the photomask to allow part of the resist layer PR to be exposed portions to the electromagnetic radiation and rest of the resist layer PR to be unexposed portions to the electromagnetic radiation; removing the photomask; and removing either the exposed portions or the unexposed portions of the resist layer PR through a developer to form the patterned resist layer PR' with the openings O. In some embodiments, each opening O is formed to have a round top-view shape. However, the disclosure is not limited thereto. In some alternative embodiments, each opening O may exhibit a polygonal shape or other suitable shapes from the top view. As shown in FIG. 1C, the sidewall of each opening O1 defined by the patterned resist layer PR' is in a vertical profile, but the disclosure is not limited thereto. In some alternative embodiments, a reentrant profile with an undercut may be observed in a lower sidewall corresponding to each opening O defined by the patterned resist layer PR'.

Figure 1D:
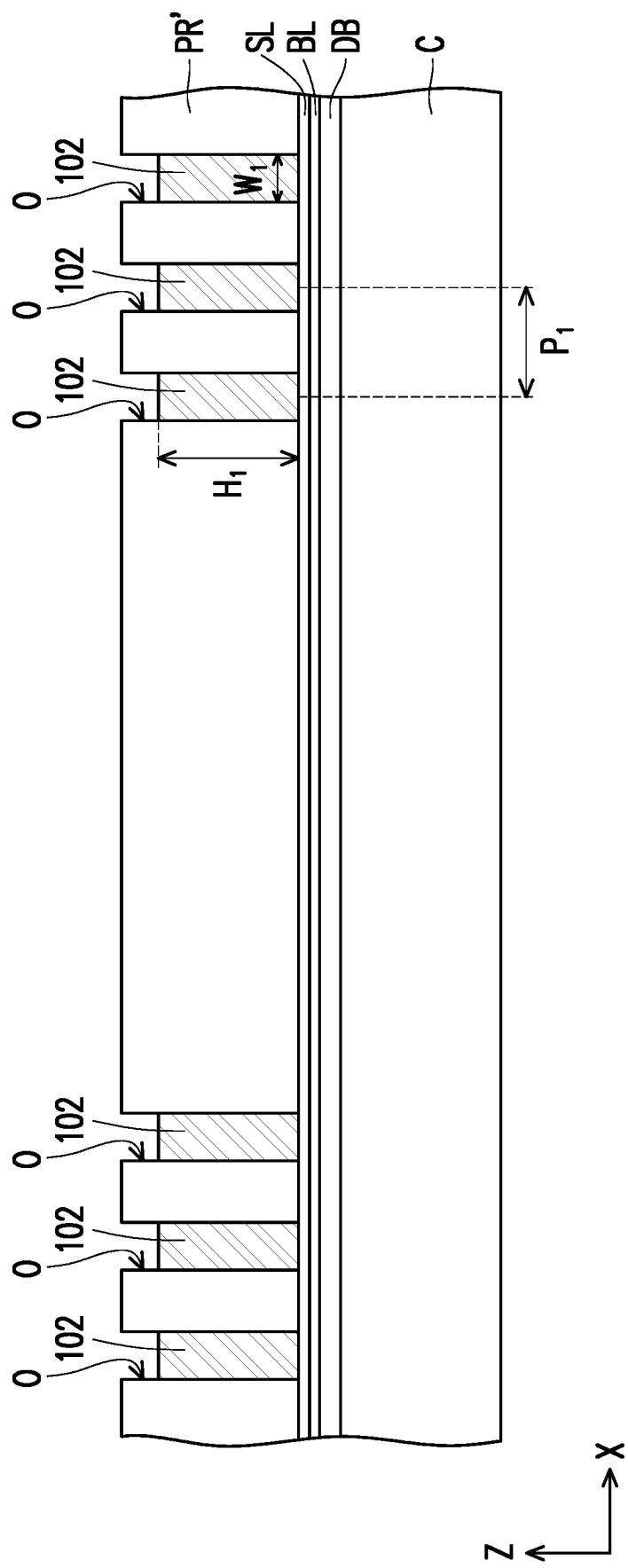

Referring to FIG. 1D, metal patterns 102 are formed on the seed layer SL and in the openings O. In some embodiments, the material of the metal patterns 102 may include copper, aluminum, titanium, nickel, tungsten, and/or alloys thereof. In some embodiments, the metal patterns 102 may be formed through electro-plating, electroless-plating, immersion plating, or the like. As shown in FIG. 1D, the illustrated top surfaces of the metal patterns 102 are lower than the illustrated top surface of the patterned resist layer PR', so that the shapes of the metal patterns 102 are confined by the openings O. That is to say, the contour of each of the metal patterns 102 is substantially identical to the contour of the corresponding opening O. In other words, the top-view shape of each of the metal patterns 102 is substantially identical to the top-view shape of the corresponding opening O. Accordingly, in some embodiments, each metal pattern 102 is formed to have a round top-view shape. However, the disclosure is not limited thereto. In some alternative embodiments, each metal pattern 102 may exhibit a polygonal shape or other suitable shapes from the top view. Moreover, as shown in FIG. 1D, due to the vertical sidewall of each opening O, the metal patterns 102 have vertical side surfaces. However, the disclosure is not limited thereto. In some alternative embodiments, due to a reentrant profile with an undercut formed in a lower sidewall of each opening O, the metal patterns 102 may not have vertical side surfaces.

In some embodiments, in a direction Z parallel to a normal direction of the carrier C, a height $H_1$ of each metal pattern 102 ranges between about 15 μm and about 360 μm. In some embodiments, in a direction X perpendicular the direction Z, a width $W_1$ of each metal pattern 102 ranges between about 5 μm and about 120 μm. In the case that each metal pattern 102 has a round top-view shape (as shown in FIG. 2A), then the width $W_1$ may be the diameter. In the case that each metal pattern 102 has a polygonal shape from the top view, then the width $W_1$ may be the maximum dimension. In some embodiments, an aspect ratio (i.e., a ratio of the height $H_1$ to the width $W_1$) of each metal pattern 102 is more than about 3, i.e., the metal patterns 102 are formed to have high aspect ratio. In certain embodiments, the aspect ratio of each metal pattern 102 is in a range from more than about 3 to about 15. As mentioned above, the metal patterns 102 are formed in and confined by the openings O of the patterned resist layer PR', thereby in the case that an aspect ratio (i.e., a ratio of the height $H_1$ to the width $W_1$) of each metal pattern 102 is more than about 3, an aspect ratio of each opening O must be more than about 3. In some embodiments, a pitch $P_1$ of two adjacent metal patterns 102 ranges between about 6 μm and about 360 μm. In certain embodiments, the pitch $P_1$ of two adjacent metal patterns 102 ranges between about 30 μm and about 120 μm, i.e., the metal patterns 102 can be formed to have high distribution density.

Figure 1E:
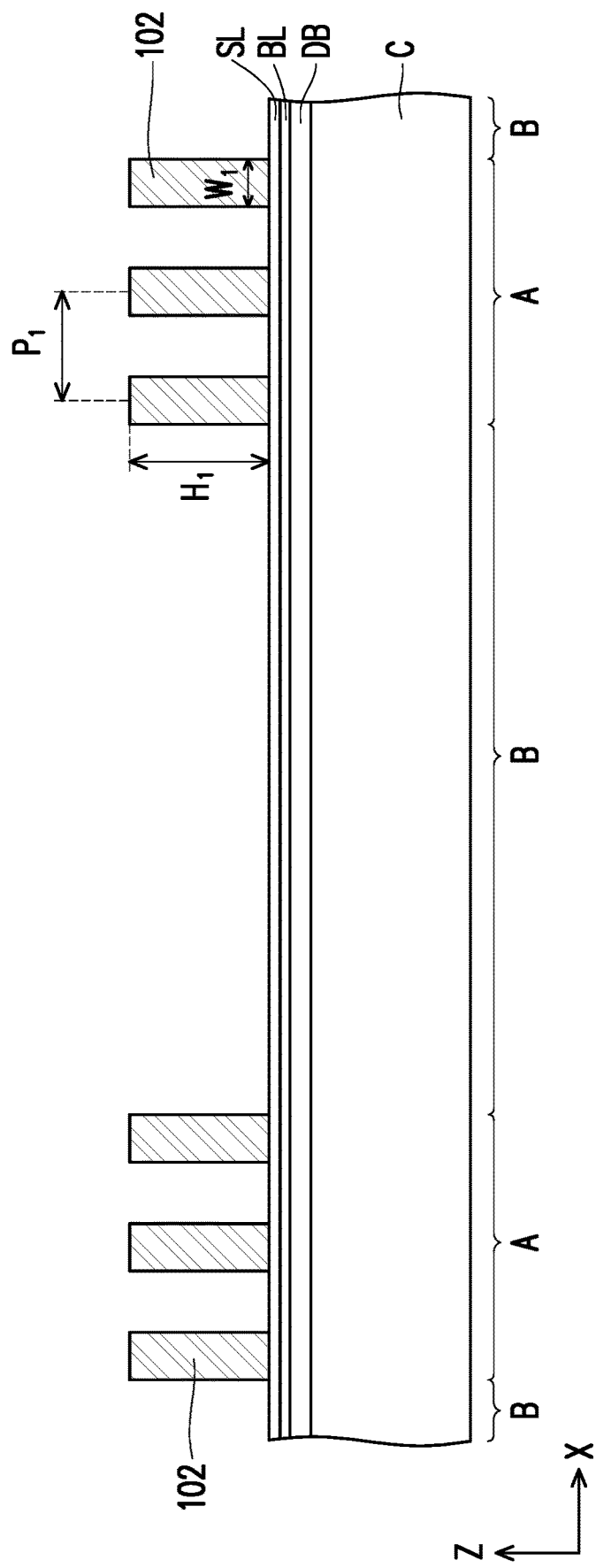
Figure 1F:
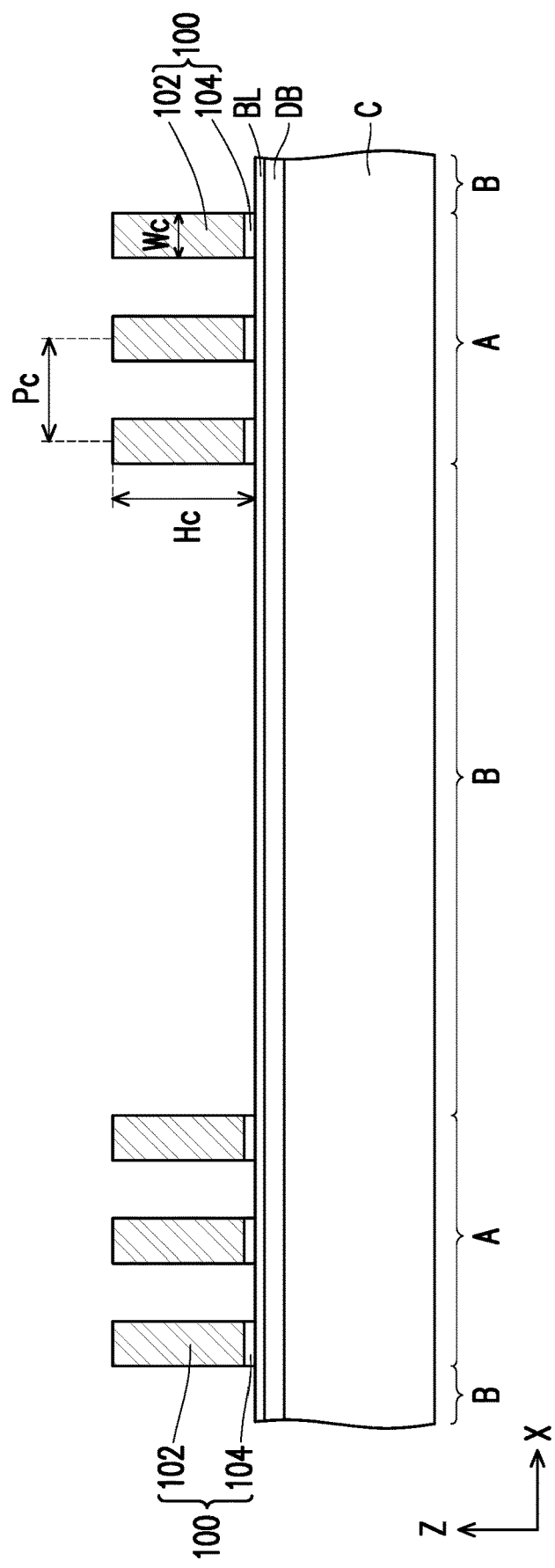

Referring to FIG. 1E, after the metal patterns 102 are formed, a stripping process is performed to the patterned resist layer PR' to remove the patterned resist layer PR'. In detail, during the stripping process, the patterned resist layer PR' is removed to expose the seed layer SL not covered by the metal patterns 102. That is to say, during the stripping process, the patterned resist layer PR' is removed, while the underlying seed layer SL and the metal patterns 102 are remained. In other words, after the stripping process, the metal patterns 102 are remained on the seed layer SL. In some embodiments, the metal patterns 102 remained on the seed layer SL are in an array, as shown in FIG. 2A which is a schematic top view illustrating a portion of the structure in the stage of FIG. 1E in accordance with some embodiments of the disclosure. In the subsequent process, the metal patterns 102 are used as a mask for partially removing the seed layer SL to render conductive through vias 100 (as shown in FIG. 1F). In view of this, referring to FIG. 2A and FIG. 1E, the structure obtained after the stripping process may have a through-via-sparse region B and through-via-dense regions A surrounded by the through-via-sparse region B. In detail, as shown in FIG. 2A, compared with the density of the metal patterns 102 in the through-via-sparse region B, the density of the metal patterns 102 in the through-via-dense region A is relatively high. Further, in FIG. 2A, there is no metal pattern 102 in the through-via-sparse region B, but the disclosure is not limited thereto. In some alternative embodiments, the metal patterns 102 may be in the through-via-sparse region B, while the density of the metal patterns 102 in the through-via-sparse region B is quite low. It should be noted that the number of the through-via-dense regions A, and the arrangement of the through-via-sparse region B and the through-via-dense regions A shown in FIG. 2A are merely for illustration, and the disclosure is not limited thereto.

During the conventional stripping process, if the metal patterns are formed to have high aspect ratio, the metal patterns at the boundary of the through-via-dense region tilt or collapse toward the neighboring through-via-sparse region, which results in failure of the resulting package structure. Referring to FIG. 2A and FIG. 1E, after the patterned resist layer PR' is removed, the metal patterns 102 in the through-via-dense regions A remain substantially intact without tilting, falling or collapsing. That is to say, the metal patterns 102 in the through-via-dense regions A can be formed to have high aspect ratio without risking tilt or collapse of the metal patterns 102 at the boundary of the through-via-dense region A. The descriptions with respect to the stripping process performed to the patterned resist layer PR' will be discussed in greater detail below in conjunction with FIGS. 3A-3E.

Referring to FIGS. 1D-1E and FIGS. 3A-3E, the stripping process is performed to the patterned resist layer PR' to dissolve the patterned resist layer PR' without dissolving the seed layer SL and the metal patterns 102. In detail, during the stripping process performed to the patterned resist layer PR', a stripping solution is applied to the patterned resist layer PR' to break the patterned resist layer PR' into pieces and dissolve the pieces in the stripping solution. In some embodiments, the stripping solution may be applied by immersion or other suitable methods.

Figure 3A:
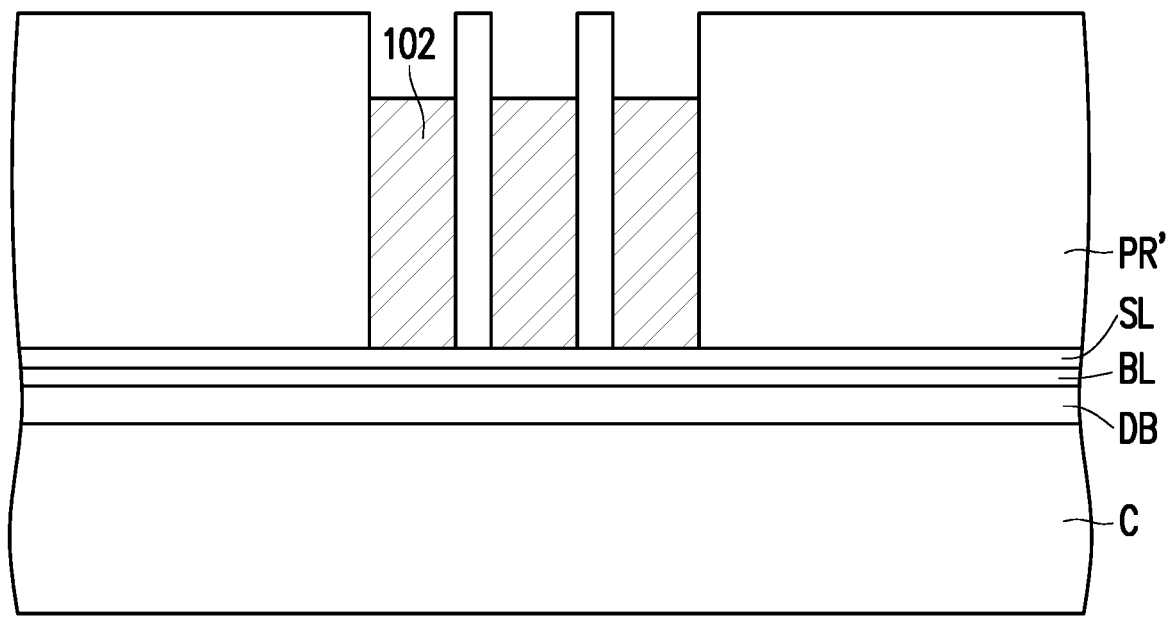
FIG. 3A to FIG. 3E are schematic cross-sectional views of various steps in a stripping process for the patterned resist layer in FIG. 1D in accordance with some embodiments of the disclosure.
Figure 3B:
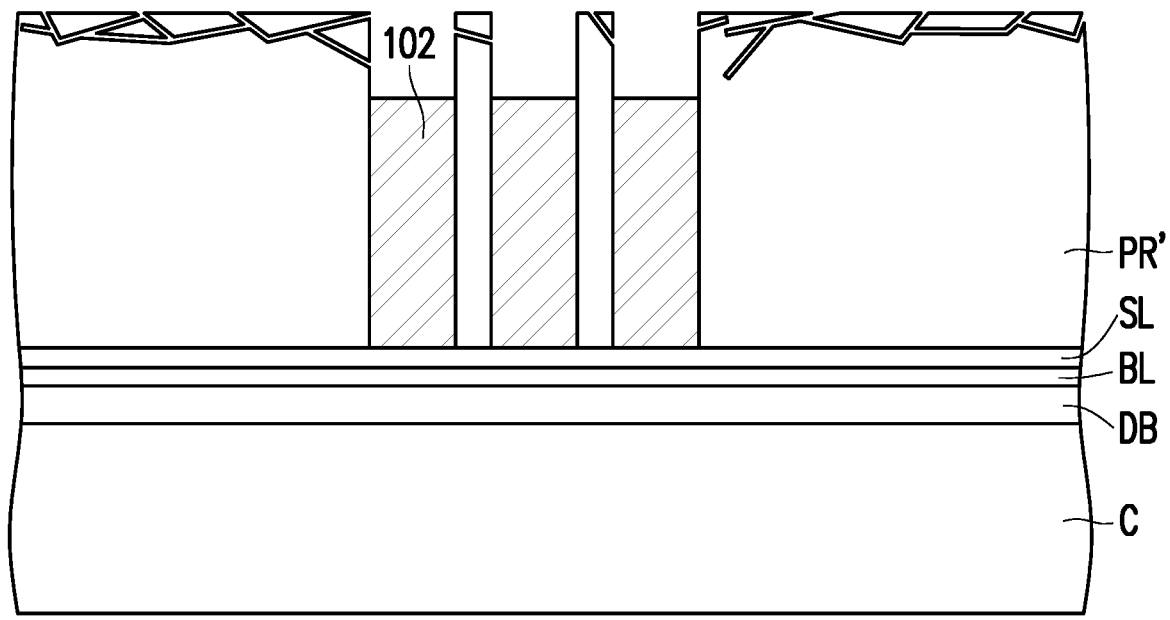
Figure 3C:
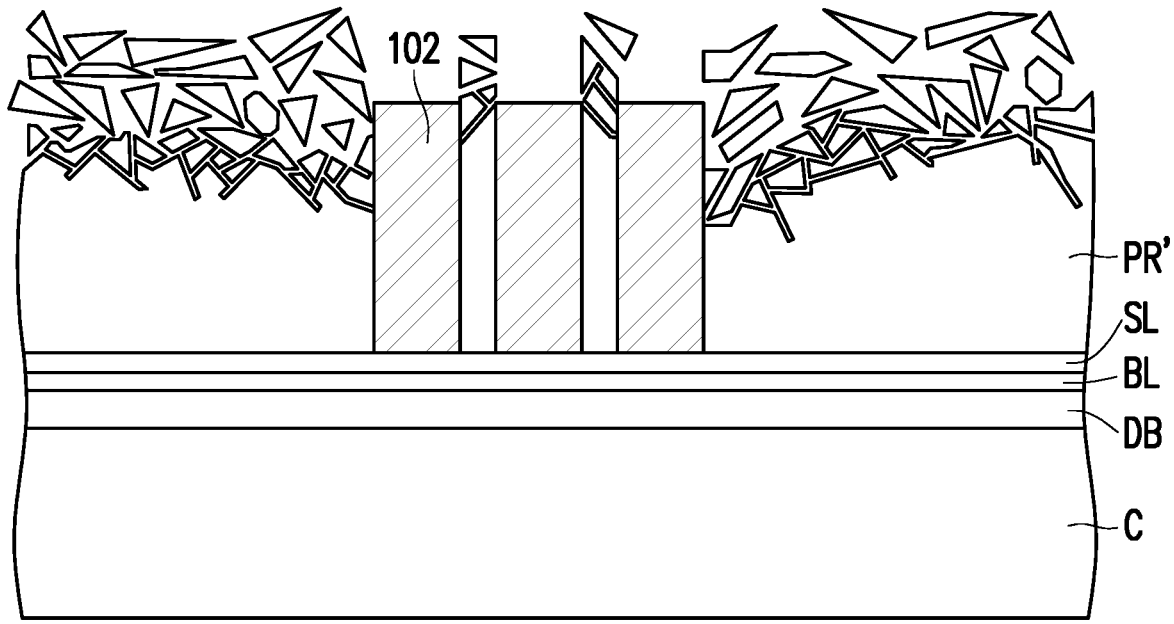
Figure 3D:
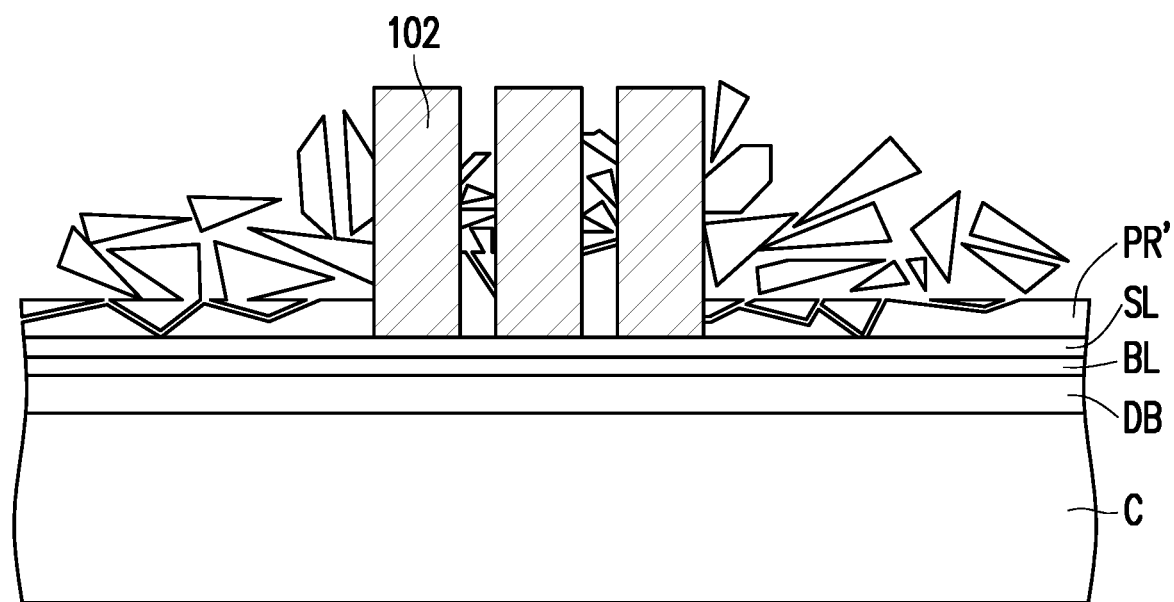

In some embodiments, the stripping solution includes a non-dimethyl sulfoxide solvent and an alkaline compound, and the non-dimethyl sulfoxide solvent includes an aprotic solvent and a protic solvent. That is to say, the stripping solution used to dissolve the patterned resist layer PR' does not contain dimethyl sulfoxide solvent. In other words, the aprotic solvent does not include dimethyl sulfoxide. In some embodiments, the aprotic solvent may include N-methylpyrrolidone (NMP), tetrahydrofuran (THF), dimethylformamide (DMF), acetonitrile (MeCN) or dichloromethance (DCM), but not limited thereto. In some embodiments, the protic solvent is, for example, an alkanolamine solvent. The alkanolamine solvent may include ethanol amine (MEA), methyl ethanol amine, 2-(2-aminoethylamino)ethanol, or diethanolamine, but not limited thereto. As shown in FIG. 3A to FIG. 3B, the patterned resist layer PR' is less likely to swell up because the non-dimethyl sulfoxide solvent is used. In certain embodiments, the swelling percentage by volume of the patterned resist layer PR' during the stripping process is approaching 0%. Large scale of swelling by volume may lead to high stress toward the metal patterns 102 and then may cause the metal patterns 102 to tilt, fall or collapse, therefore by using the non-dimethyl sulfoxide solvent, the stripping solution of the disclosure may minimize the fail ratio (e.g., tilt/collapse percentage) of the metal patterns 102. In some embodiments, the alkaline compound is, for example, a strong alkaline compound. The strong alkaline compound may include tetra-methyl ammonium hydroxide (TMAH), potassium hydroxide (KOH), sodium hydroxide (NaOH) or a combination thereof. In certain embodiments, the alkaline compound includes a mixture of TMAH and KOH. In detail, the alkaline compound may permeate into the patterned resist layer PR' while the non-dimethyl sulfoxide solvent permeates into the patterned resist layer PR', and then the alkaline compound may react with the crosslinked structure of the patterned resist layer PR' through the reaction to break the crosslinked structure (i.e., to decompose the patterned resist layer PR'). Moreover, the protic solvent has a protic character, so that the protic solvent may accelerate the dissolve rate of the decomposed patterned resist layer PR' into the non-dimethyl sulfoxide solvent.

Figure 3E:
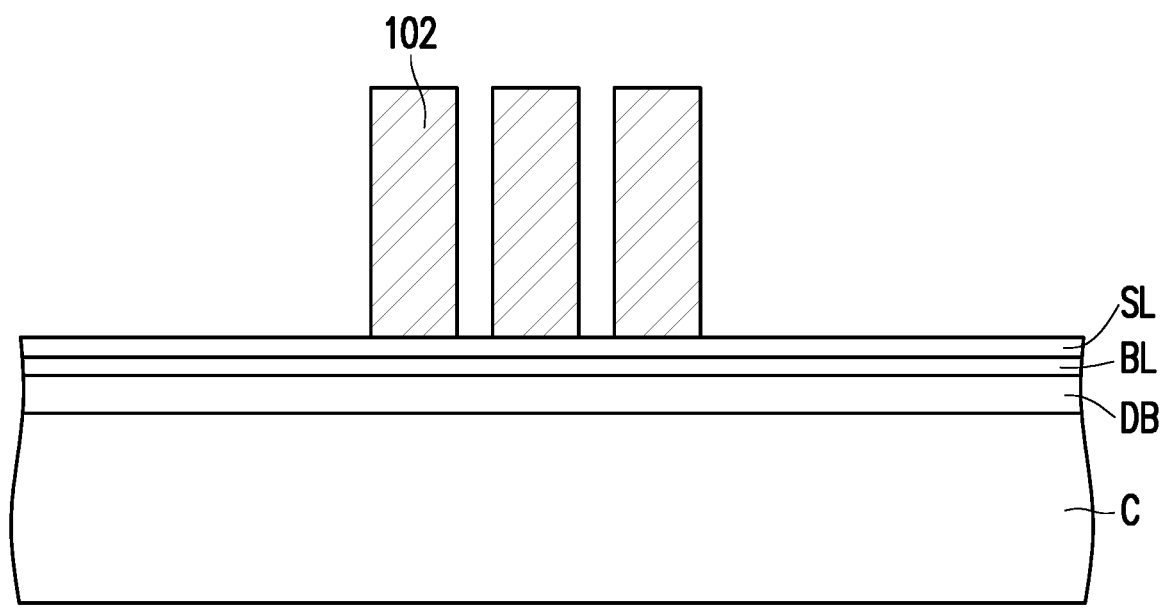

As mentioned above, when the stripping solution includes the alkaline compound and the non-dimethyl sulfoxide solvent containing the aprotic solvent and the protic solvent, the tilt/collapse percentage of the metal patterns 102 may be minimized, and the dissolve rate of the decomposed patterned resist layer PR' into the non-dimethyl sulfoxide solvent may be increased. As such, referring to FIG. 3B to FIG. 3D, by using the said stripping solution, the patterned resist layer PR' can be broke into pieces layer-by-layer from top to bottom, and the said pieces can be dissolved into the stripping solution. As a result, referring to FIG. 3D to FIG. 3E, there is little or no pulling force applied on the metal patterns 102 when some pieces peeling off from the metal patterns 102. That is to say, by using the said stripping solution, the broken pieces of the patterned resist layer PR' are small enough not to cause the metal patterns 102 to tilt or collapse. In other words, while the metal patterns 102 have a high aspect ratio of more than about 3, by applying the stripping solution including the alkaline compound and the non-dimethyl sulfoxide solvent containing the aprotic solvent and the protic solvent to the patterned resist layer PR' in the stripping process, the metal patterns 102 in the through-via-dense regions A can remain substantially intact without tilting or collapsing, while the patterned resist layer PR' is removed by the stripping solution. Therefore, the performance and the quality of the subsequently formed package structure 10 may be ensured. Further, as shown in FIG. 3E, during the stripping process with the said stripping solution, the patterned resist layer PR' above the seed layer SL can be sufficiently removed without the presence of residue. That is to say, while the metal patterns 102 are arranged to have high distribution density (e.g., the pitch $P_1$ of two adjacent metal patterns 102 ranges between about 30 μm and about 120 μm), the stripping solution including the alkaline compound and the non-dimethyl sulfoxide solvent containing the aprotic solvent and the protic solvent used to remove the patterned resist layer PR' still has good wetting ability. Accordingly, the performance and the quality of the subsequently formed package structure 10 may be ensured.

In some embodiments, based on a total weight of the stripping solution, an amount of the aprotic solvent is about 20 wt % to about 70 wt %, an amount of the protic solvent is about 20 wt % to about 70 wt %, and an amount of the alkaline compound is about 0.5 wt % to about 5.5 wt %. In certain embodiments, in the case where the alkaline compound includes KOH, based on a total weight of the stripping solution, an amount of KOH is about 0.5 wt % to about 2.5 wt %. In certain embodiments, in the case where the alkaline compound includes TMAH, based on a total weight of the stripping solution, an amount of TMAH is about 0.5 wt % to about 3 wt %. In certain embodiments, in the case where the aprotic solvent is used in an amount of about 20 wt % to about 70 wt %, the protic solvent is used in an amount of about 20 wt % to about 70 wt % and the alkaline compound is used in an amount of about 0.5 wt % to about 5.5 wt %, then the fail ratio (e.g., tilt/collapse percentage) of the metal patterns 102 during the stripping process can be improved by about 35%. In some embodiments, a ratio of an amount of the aprotic solvent to an amount of the protic solvent ranges from about 1:3.5 to about 3.5:1. Specifically, in case where the aprotic solvent and the protic solvent are used in the designated ratio, then the fail ratio (e.g., tilt/collapse percentage) of the metal patterns 102 during the stripping process can be improved by about 35%. In certain embodiments, a ratio of an amount of the aprotic solvent to an amount of the protic solvent may be 1:1. In some embodiments, the process time of the stripping process ranges from about 1 minute to about 180 minutes. In some embodiments, the process temperature of the stripping process ranges from about 25° C. to about 100° C. Specifically, in case where the process time and the process temperature of the stripping process fall within the above designated range, then the fail ratio (e.g., tilt/collapse percentage) of the metal patterns 102 during the stripping process can be improved by about 35%.

Referring back to FIG. 1E and FIG. 1F, after the removal of the patterned resist layer PR', the portion of the seed layer SL not covered by the metal patterns 102 is removed to form seed layer patterns 104 between the buffer layer BL and the metal patterns 102. That is to say, the metal patterns 102 are serve as a mask for partially removing the seed layer SL. In other words, the seed layer patterns 104 are originated from the portion of the seed layer SL covered by the metal patterns 102. In some embodiments, the seed layer SL is partially removed through an etching process, such as an anisotropic etching process or an isotropic etching process.

As mentioned above, during the stripping process, the patterned resist layer PR' can be sufficiently removed without the presence of residue while the metal patterns 102 can remain substantially intact without tilting or collapsing by using the stripping solution including the alkaline compound and the non-dimethyl sulfoxide solvent containing the aprotic solvent and the protic solvent. In view of this, the contour of the seed layer patterns 104 formed after the removal of the patterned resist layer PR' and by using the metal patterns 102 as an etching mask is substantially identical to the contour of the metal patterns 102, as shown in FIG. 1F. That is to say, the edge of each of the seed layer patterns 104 is substantially flushed with the edge of the corresponding overlying metal pattern 102. Since the contour of the seed layer patterns 104 are identical to the contour of the metal patterns 102, the electrical leakage problem caused by mismatch in shapes of the seed layer pattern and metal patterns may be effectively eliminated, thereby ensuring the performance and the quality of the subsequently formed package structure 10. In some embodiments, in the case where each metal pattern 102 has a round top-view shape, each seed layer pattern 104 is formed to have a round top-view shape. However, the disclosure is not limited thereto. In some alternative embodiments, each seed layer pattern 104 may exhibit a polygonal shape or other suitable shapes from the top view.

In some embodiments, the seed layer patterns 104 and the metal patterns 102 are collectively referred to as conductive through vias 100. As illustrated in FIG. 1F, the conductive through vias 100 are disposed on the buffer layer BL. As mentioned above, after the removal of the patterned resist layer PR' by applying the stripping solution including the alkaline compound and the non-dimethyl sulfoxide solvent containing the aprotic solvent and the protic solvent to the patterned resist layer PR', the metal patterns 102 can remain substantially intact without tilting or collapsing, thereby the conductive through vias 100 formed by using the metal patterns 102 as a mask can be formed to substantially stand vertically on the buffer layer BL. That is to say, the conductive through vias 100 may protrude from the buffer layer BL substantially along the direction Z. In other words, an extending direction which the conductive through via 100 along with and the direction Z may has an angular offset of less than 1°. Accordingly, the manufacturing yield of the conductive through vias 100 is significantly improved. In some embodiments, more than or equal to 95% of the conductive through vias 100 have no angular offset relative to the direction Z, and less than or equal to 5% of the conductive through vias 100 have the angular offset from the direction Z of less than 1°. In some alternative embodiments, almost all of the conductive through vias 100 have no angular offset relative to the direction Z.

In some embodiments, since the metal patterns 102 are formed in an array (as shown in FIG. 2A), the conductive through vias 100 of which the metal patterns 102 are parts are formed in an array, as shown in FIG. 2B which is a schematic top view illustrating a portion of the structure in the stage of FIG. 1F in accordance with some embodiments of the disclosure. In some embodiments, in the direction Z, a height Hc of each conductive through via 100 ranges between about 15 µm and about 360 µm. In some embodiments, in the direction X perpendicular the direction Z, a width Wc of each conductive through via 100 ranges between about 5 µm and about 120 µm. In the case that the each conductive through via 100 has a round top-view shape (as shown in FIG. 2B), then the width Wc may be the diameter. In the case that each conductive through via 100 has a polygonal shape from the top view, then the width Wc may be the maximum dimension.

In some embodiments, an aspect ratio (i.e., a ratio of the height Hc to the width Wc) of each conductive through via 100 is more than about 3, i.e., the conductive through vias 100 are formed to have high aspect ratio. That is to say, by applying the stripping solution including the alkaline compound and the non-dimethyl sulfoxide solvent containing the aprotic solvent and the protic solvent in the stripping process to render the metal patterns 102 having high aspect ratio without tilting or collapsing, the conductive through vias 100 having high aspect ratio can be formed accordingly. In certain embodiments, the aspect ratio of each conductive through via 100 is in a range from more than about 3 to about 15. Moreover, in some embodiments, a pitch Pc of two adjacent conductive through vias 100 ranges between about 6 µm and about 360 µm. In certain embodiments, the pitch Pc of two adjacent conductive through vias 100 ranges between about 30 µm and about 120 µm, i.e., the conductive through vias 100 can be formed to have high distribution density. As mentioned above, since the stripping solution including the alkaline compound and the non-dimethyl sulfoxide solvent containing the aprotic solvent and the protic solvent used to remove the patterned resist layer PR' has good wetting ability even while the metal patterns 102 are arranged to have high distribution density, the conductive through vias 100 having high distribution density and having the contour identical to the contour of the metal patterns 102 can be formed accordingly. Therefore, the performance and the quality of the subsequently formed package structure 10 may be ensured.

Figure 1G:
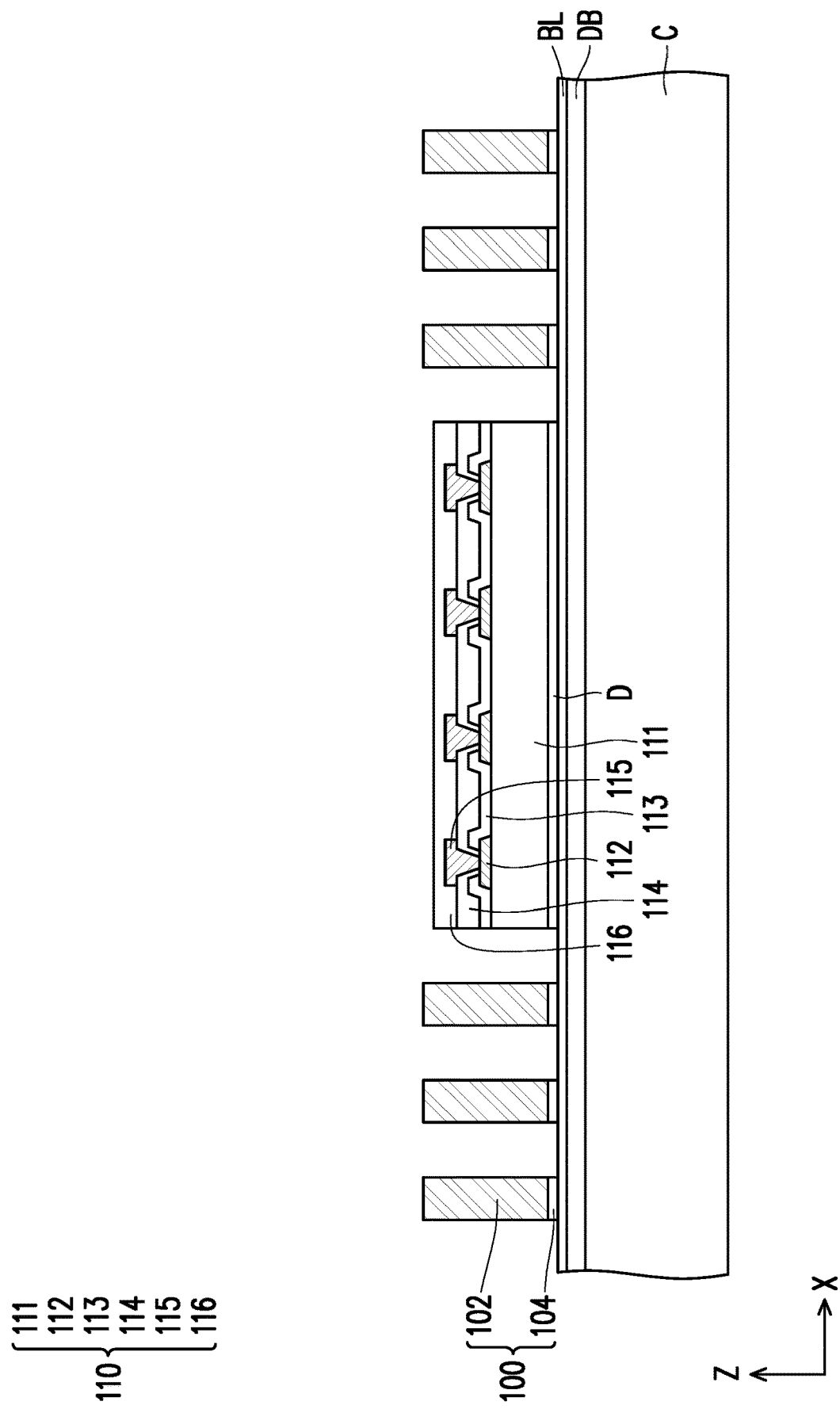

Referring to FIG. 1G, at least one die 110 may be picked and placed onto the buffer layer BL. The die 110, for example, includes a semiconductor substrate 111, a plurality of conductive pads 112, a passivation layer 113, a post-passivation layer 114, a plurality of conductive pillars 115, and a protection layer 116. In detail, the die 110 is placed on the buffer layer BL in a way that the semiconductor substrate 111 of the die 110 is attached (or adhered) to the buffer layer BL. In some embodiments, the die 110 is attached (or adhered) to the buffer layer BL through a bonding film D. In some embodiments, the bonding film D may be an adhesive film, such as a die attach film (DAF). In some alternative embodiments, the bonding film D may be any materials used for fusion bonding. For example, the bonding film D may be an oxide-based film (e.g., silicon oxide film) used for oxide-oxide fusion bonding.

In some embodiments, the die 110 may be a logic die (e.g., central processing unit (CPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), or the like. In some embodiments, the conductive pads 112 are disposed over the semiconductor substrate 111. The passivation layer 113 is formed over the semiconductor substrate 111 and has contact openings that partially expose the conductive pads 112. The semiconductor substrate 111 may be a silicon substrate including active components (e.g., transistors or the like) and passive components (e.g., resistors, capacitors, inductors or the like) formed therein. The conductive pads 112 may be aluminum pads, copper pads, or other suitable metal pads. The passivation layer 113 may be a silicon oxide layer, a silicon nitride layer, a silicon oxynitride layer, or a dielectric layer formed by other suitable dielectric materials. Furthermore, the post-passivation layer 114 is formed over the passivation layer 113. The post-passivation layer 114 covers the passivation layer 113 and has a plurality of contact openings. The conductive pads 112 are partially exposed by the contact openings of the post passivation layer 240. The post-passivation layer 114 may be a polyimide (PI) layer, a polybenzoxazole (PBO) layer, or a dielectric layer formed by other suitable polymers. In addition, the conductive pillars 115 are formed extend through the contact openings in the post passivation layer 240 and are mechanically and electrically coupled to the corresponding conductive pads 112. In some embodiments, the conductive pillars 115 may be plated copper pillars. The protection layer 116 is formed on the post-passivation layer 114 so as to cover the conductive pillars 115. The material of protection layer 116 may be a polymer such as PBO, PI, benzocyclobutene (BCB), or the like; a nitride such as silicon nitride or the like; an oxide such as silicon oxide or the like; or a combination thereof. The protection layer 116 may be formed, for example, by spin coating, lamination, chemical vapor deposition (CVD), or the like.

In some embodiments, in the direction Z, the die 110 has a thickness less than a height of the conductive through vias 100, as shown in FIG. 1G. However, the disclosure is not limited thereto. In some alternative embodiments, in the direction Z, the thickness of the die 110 may be greater than or substantially equal to the height of the conductive through vias 100. As shown in FIG. 1G, the die 110 is picked and placed onto the buffer layer BL after the formation of the conductive through vias 100. However, the disclosure is not limited thereto. In some alternative embodiments, one or more die(s) 200 may be picked and placed onto the buffer layer BL prior to the formation of the conductive through vias 100. In the exemplary embodiment, only one die 110 is illustrated in FIG. 1G. However, it should be noted that the number of die 110 placed on the buffer layer BL is not limited thereto, and this can be adjusted based on design requirement. In some embodiments, when more than one dies 200 are placed on the buffer layer BL, the dies 200 may be arranged in an array, and when the dies 200 are arranged in an array, the conductive through vias 100 may be classified into groups.

Figure 1H:
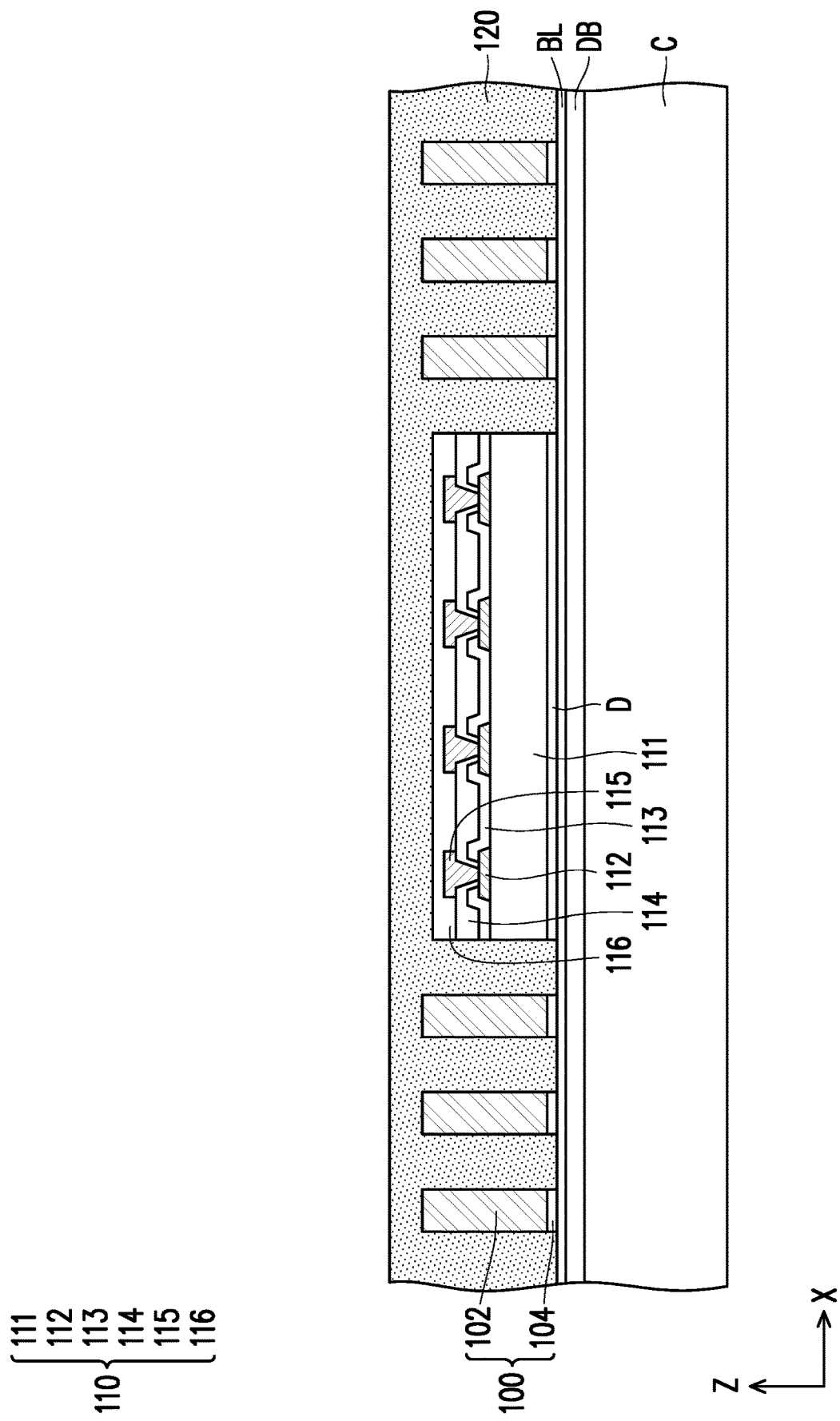

Referring to FIG. 1H, an encapsulant 120 is formed over the buffer layer BL to encapsulate the die 110, and the conductive through vias 100. In detail, the encapsulant 120 is formed to fill the gaps between the die 110 and the conductive through vias 100 and the gaps between the adjacent conductive through vias 100, so that the encapsulant 120 covers the sidewalls and the illustrated top surfaces of the die 110 and the conductive through vias 100. That is to say, the die 110 and the conductive through vias 100 are embedded in the encapsulant 120, and are not revealed. From another point of view, the encapsulant 120 may be referred to as "gap-fill material". In some embodiments, the material of the encapsulant 120 may include a molding compound, a molding underfill, a resin (such as epoxy), or the like. In some alternative embodiments, the material of the encapsulant 120 may include nitride such as silicon nitride, oxide such as silicon oxide, phosphosilicate glass (PSG), borosilicate glass (BSG), boron-doped phosphosilicate glass (BPSG), a combination thereof, or the like. In yet alternative embodiments, the material of each of the encapsulant 120 may be organic material (e.g., epoxy, PI, PBO, or the like), or the mixture of inorganic and organic materials (e.g., the mixture of silicon oxide and epoxy, or the like). In some embodiments, the encapsulant 120 may be formed by a molding process, such as a compression molding process. In some alternative embodiments, the encapsulant 120 may be formed through suitable fabrication techniques such as CVD, high-density plasma chemical vapor deposition (HDPCVD) or plasma-enhanced chemical vapor deposition (PECVD).

Figure 1I:
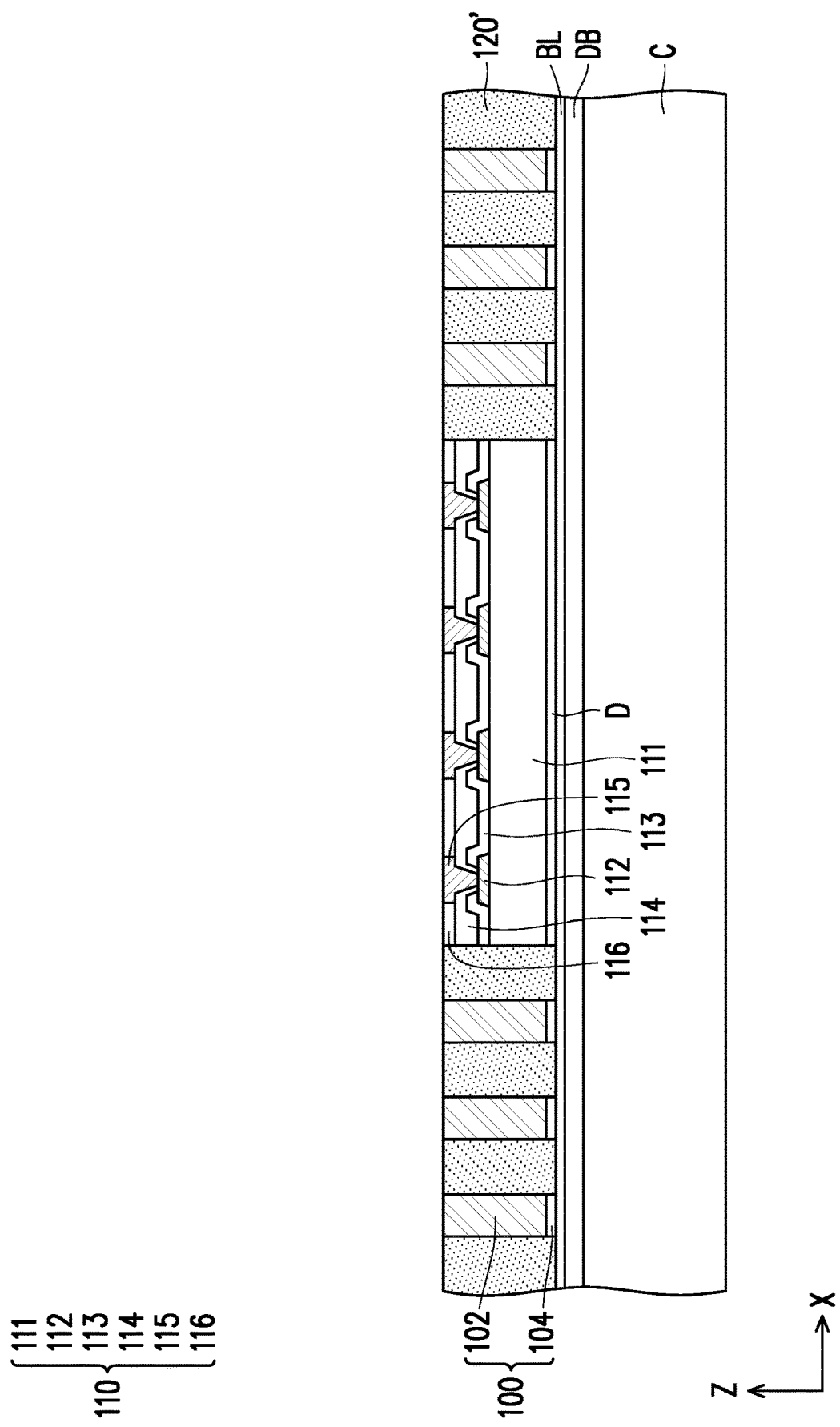

Referring to FIG. 1I, a planarization process is then performed on the encapsulant 120, the die 110 and the conductive through vias 100 until the illustrated top surfaces of the conductive pillars 115 and the illustrated top surfaces of the conductive through vias 100 are exposed. After the planarization process is performed on the encapsulant 120, an encapsulant 120' is formed over buffer layer BL. In some embodiments, the illustrated top surfaces of the conductive through vias 100, the conductive pillars 115, the protection layer 116, and the encapsulant 120' are substantially coplanar after the planarization process. In some embodiments, the planarization process may be, for example, a chemical-mechanical polish (CMP), a grinding process, or the like. In some embodiments, after the planarization process, a cleaning process may be optionally performed. For example, the cleaning process is preformed to clean and remove the residue generated from the planarization process. However, the disclosure is not limited thereto, and the planarization process may be performed through any other suitable method. The conductive through vias 100 penetrate the encapsulant 120', and the conductive through vias 100 are referred to as through integrated fan-out vias.

Figure 1J:
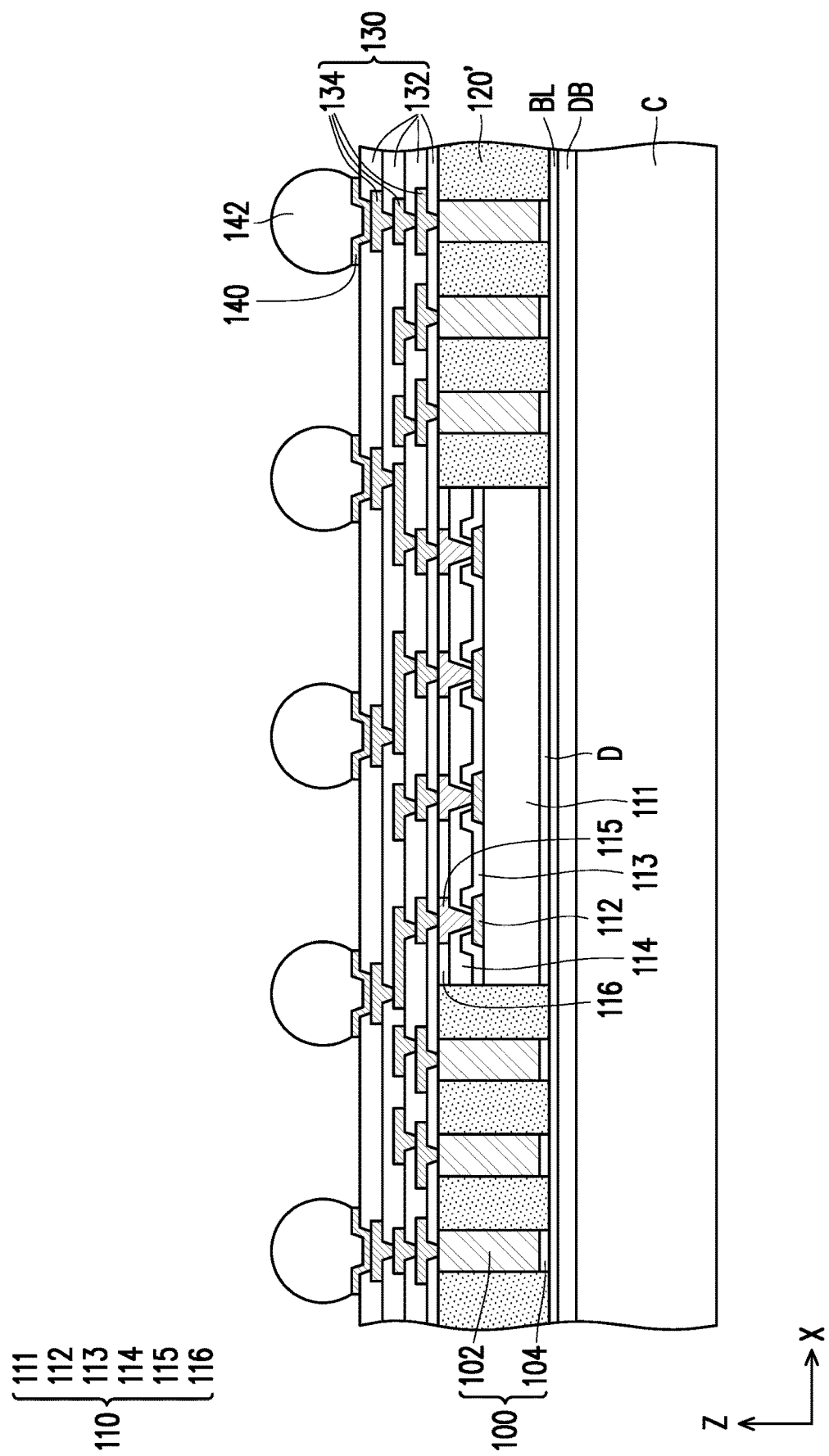

Referring to FIG. 1J, after the planarization process, a redistribution layer 130 is formed on the encapsulant 120', the conductive through vias 100 and the die 110. In some embodiments, the redistribution layer 130 is formed on the illustrated top surfaces of the conductive through vias 100, the conductive pillars 115, the protection layer 116, and the encapsulant 120'. That is, the redistribution layer 130 is formed on the encapsulant 120' along the stacking direction (e.g. the direction Z) of the carrier C and the die 110. In some embodiments, the redistribution layer 130 is electrically connected to the conductive through vias 100, and is electrically connected to the die 110 through the conductive pillars 115. In some embodiments, the die 110 is electrically connected to the conductive through vias 100 through the redistribution layer 130.

Furthermore, in some embodiments, the formation of the redistribution layer 130 includes sequentially forming one or more dielectric layers 132, and one or more conductive layers 134 in alternation. In certain embodiments, the conductive layers 134 are sandwiched between the dielectric layers 132. Although three layers of the conductive layers 134 and four layers of dielectric layers 132 are illustrated herein, the scope of the disclosure is not limited by the embodiments of the disclosure. In other embodiments, the number of the conductive layers 134 and the number of the dielectric layers 132 may be adjusted based on product requirement. In some embodiments, the conductive layers 134 are electrically connected to the conductive pillars 115 of the die 110. Furthermore, the conductive layers 134 are electrically connected to the conductive through vias 100.

In some embodiments, the material of the dielectric layers 132 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the material of the dielectric layers 132 may be formed by suitable fabrication techniques such as spin-on coating, CVD, HDPCVD, PECVD, atomic layer deposition (ALD) or the like. In some embodiments, the material of the conductive layers 134 may be made of conductive materials formed by electroplating or deposition, such as aluminum, titanium, copper, nickel, tungsten, and/or alloys thereof, which may be patterned using a photolithography and etching process. In some embodiments, the conductive layers 134 may be patterned copper layers or other suitable patterned metal layers.

After forming the redistribution layer 130, a plurality of conductive pads 140 are disposed on an exposed top surface of the topmost layer of the conductive layers 134. In certain embodiments, the conductive pads 140 are, for example, under-ball metallurgy (UBM) patterns used for ball mount. As shown in FIG. 1J, the conductive pads 140 are formed on and electrically connected to the redistribution layer 130. In some embodiments, the material of the conductive pads 140 may include copper, nickel, titanium, tungsten, or alloys thereof or the like, and may be formed by an electroplating process, for example. The number of conductive pads 140 are not limited in this disclosure, and may be selected based on the design layout. In some alternative embodiments, the conductive pads 140 may be omitted. In other words, conductive elements 142 (described hereinafter) formed in subsequent steps may be directly disposed on the redistribution layer 130.

After forming the conductive pads 140, a plurality of conductive elements 142 is disposed on the conductive pads 140 and over the redistribution layer 130. In some embodiments, the conductive elements 142 may be disposed on the conductive pads 140 by a ball placement process and/or reflow process, or other suitable forming method. In some embodiments, the conductive elements 142 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive elements 142 are connected to the redistribution layer 130 through the conductive pads 140. In certain embodiments, some of the conductive elements 142 may be electrically connected to the die 110 through the redistribution layer 130. Furthermore, some of the conductive elements 142 may be electrically connected to the conductive through vias 100 through the redistribution layer 130. The number of the conductive elements 142 is not limited to the disclosure, and may be designated and selected based on the number of the conductive pads 140. The material of the conductive elements 142, for example, may include a conductive material such as solder, copper, aluminum, gold, nickel, silver, palladium, tin, or a combination thereof. In one embodiment, the material of the conductive elements 142, for example, may be solder-free.

Figure 1K:
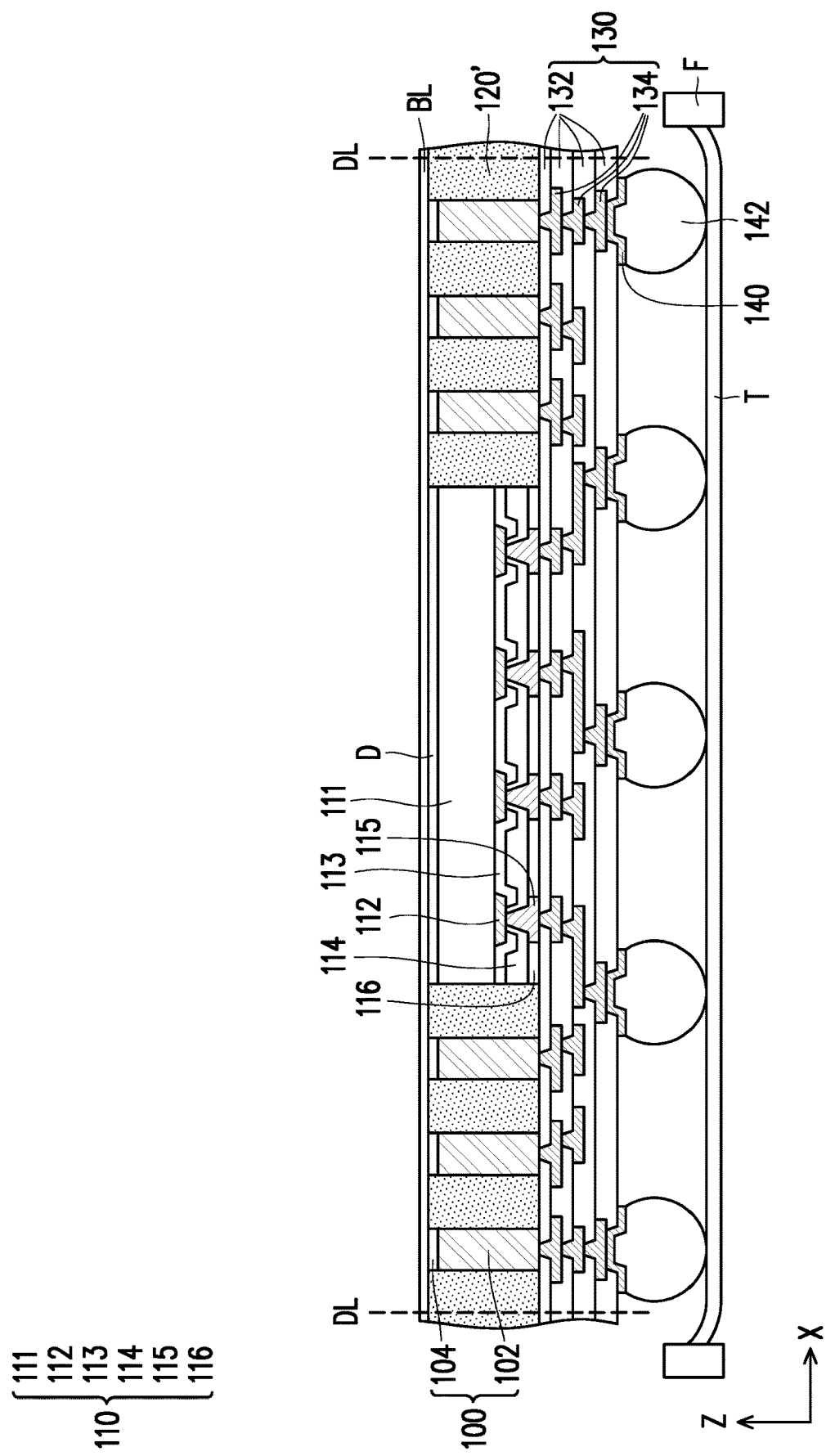

Referring to FIG. 1K, after forming the redistribution layer 130 and placing the conductive elements 142 thereon, the structure shown in FIG. 1J may be turned upside down and attached to a tape T (e.g., a dicing tape) supported by a frame F. In some embodiments, the conductive elements 142 are in contact with tape T. As illustrated in FIG. 1K, the carrier C is debonded and is separated from the buffer layer BL. In some embodiments, the de-bonding process includes projecting a light such as a laser light or an UV light on the de-bonding layer DB (e.g., the LTHC release layer) so that the carrier C can be easily removed along with the de-bonding layer DB. During the de-bonding step, the tape T is used to secure the package structure before de-bonding the carrier C and the de-bonding layer DB. After the de-bonding process, a backside surface (i.e., the illustrated top surface in FIG. 1K) of the buffer layer BL is revealed or exposed.

Figure 1L:
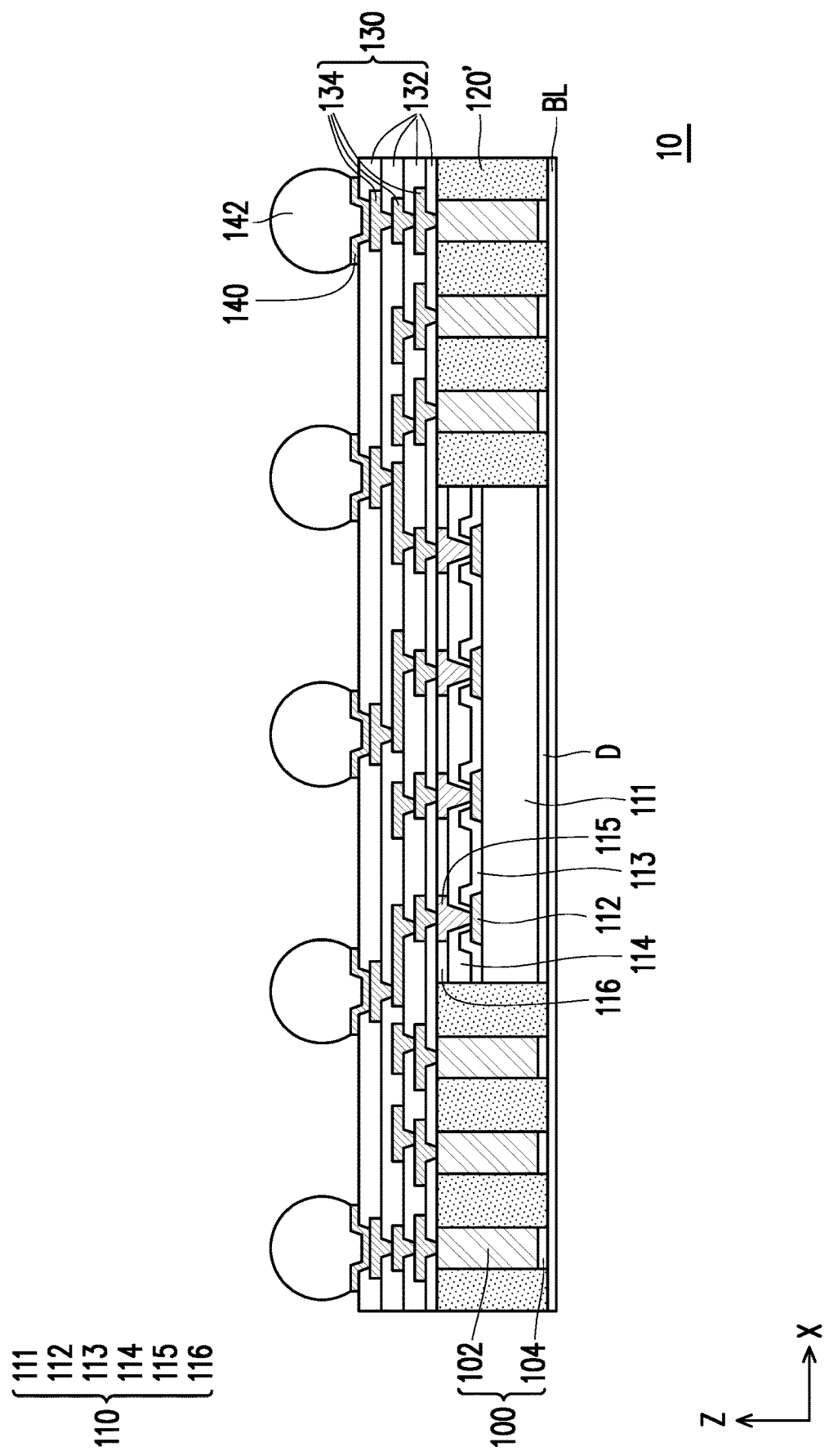

Referring to both FIG. 1K and FIG. 1L, after the de-bonding process, a dicing process is performed along dicing lines DL to cut the whole structure shown in FIG. 1K (i.e., cutting through the buffer layer BL, the encapsulant 120', and the redistribution layer 130) into a plurality of package structures 10. The package structures 10 are referred to as integrated fan-out (InFO) packages. In the exemplary embodiment, the dicing process is a wafer dicing process including mechanical blade sawing or laser cutting. In a subsequent process, the separated package structures 10 may, for example, be disposed onto a circuit substrate or onto other components based on requirements.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 4:
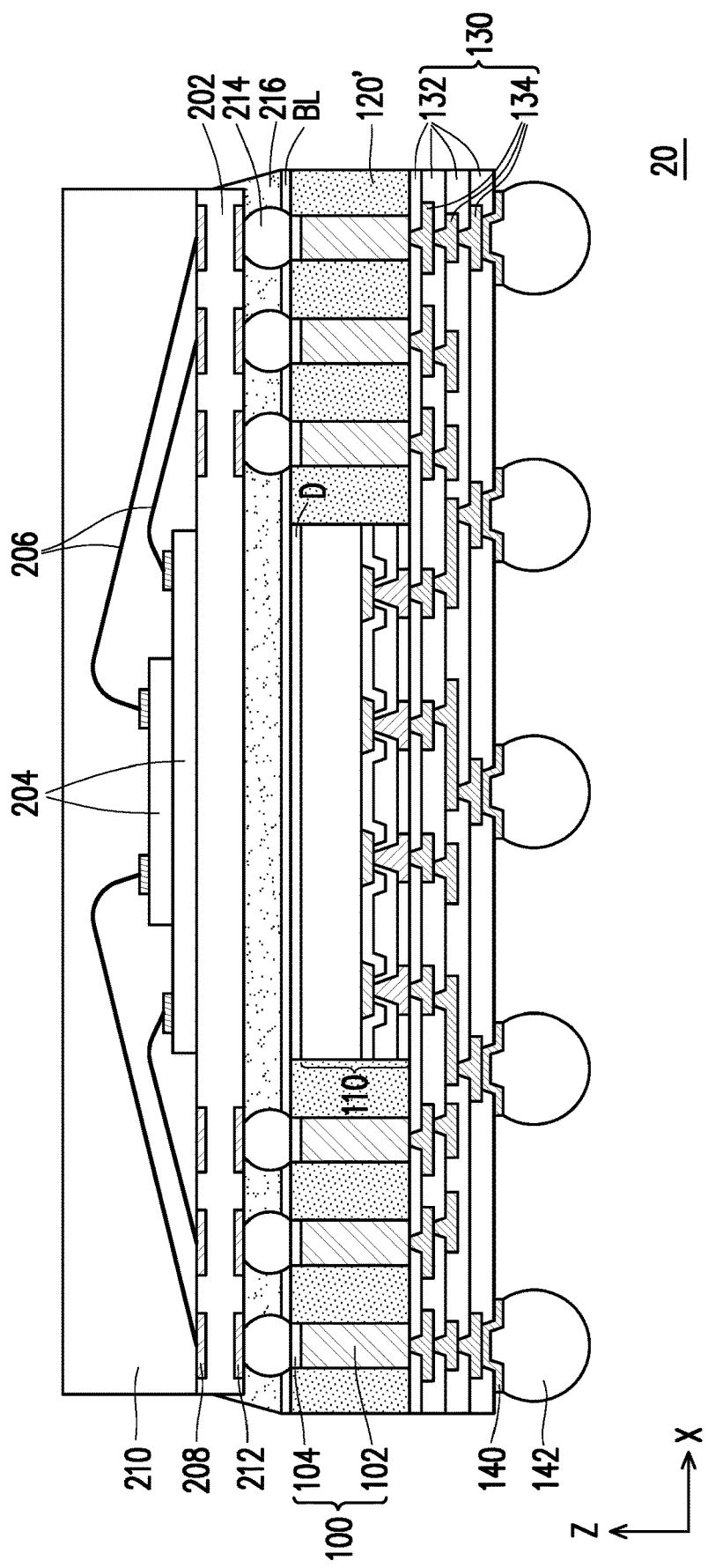
FIG. 4 is a schematic sectional view of a package structure in accordance with some alternative embodiments of the disclosure.

FIG. 4 is a schematic sectional view of a package structure in accordance with some alternative embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 4, after fabricating a first package, such as the package structure 10 illustrated in FIG. 1L, a second package 200 may be stacked on the package structure 10 (first package) so as to form a package-on-package (PoP) structure 20. As illustrated in FIG. 4, the second package 200 is electrically connected to the conductive through vias 100 of the package structure 10 (first package). In some embodiments, the second package 200 has a substrate 202, semiconductor dies 204, bonding wires 206, conductive pads 208, conductive pads 212, and an encapsulant 210. In some embodiments, the semiconductor dies 204 are mounted on the illustrated top surface of the substrate 202 shown in FIG. 4. In some embodiments, the bonding wires 206 are used to provide electrical connections between the semiconductor dies 204 and the conductive pads 208 (such as bonding pads). In some embodiments, the encapsulant 210 is formed to encapsulate and protect the semiconductor dies 204 and the bonding wires 206. In some embodiments, interconnects (not shown) or conductive through vias (not shown) embedded in the substrate 202 may be used to provide electrical connections between the conductive pads 208 and the conductive pads 212 (such as bonding pads). In some embodiments, the conductive pads 208 and the conductive pads 212 are respectively disposed on two opposite surfaces of the substrate 202, as shown in FIG. 4. In certain embodiments, the conductive pads 212 are electrically connected to the semiconductor dies 204 through the interconnects (not shown) or the conductive through vias (not shown). In some embodiments, the conductive pads 212 of the package structure 200 are electrically connected to conductive elements 214. Furthermore, the conductive elements 214 are electrically connected to the conductive through vias 100 of the package structure 10 (first package). In some embodiments, an underfill 216 is further provided to fill the gap between the second package 200 on the package structure 10 (first package) to protect the conductive elements 214. Owing to the underfill 216, a bonding strength between the second package 200 and the package structure 10 (first package) are enhanced, thereby improving the reliability of the package structure depicted in FIG. 4. After stacking the second package 200 on the package structure 10 (first package) and providing electrical connection therebetween, the package-on-package structure 20 can be fabricated.

Figure 5:
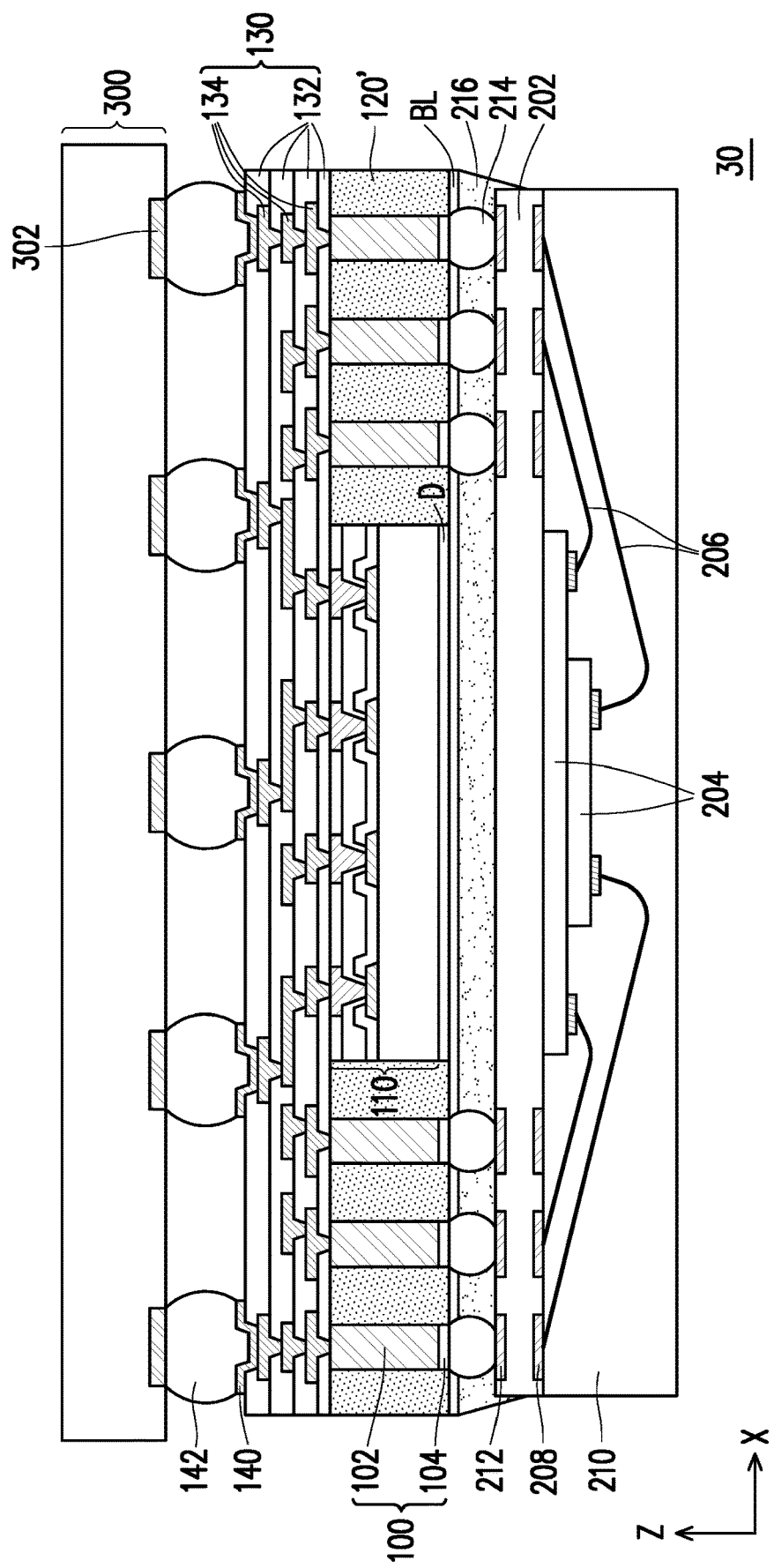
FIG. 5 is a schematic sectional view of a package structure in accordance with some alternative embodiments of the disclosure.

FIG. 5 is a schematic sectional view of a package structure in accordance with some alternative embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 5, in some embodiments, a package component 300 is provided, where the package-on-package structure 20 depicted in FIG. 4 is bonded on the package component 300 to form the package structure having a stacked structure. In some embodiments, the package component 300 includes conductive pads 302. In some embodiments, the package component 300 is a package substrate, which may be a coreless substrate or a substrate having a core. In some alternative embodiments, the package component 300 is a printed circuit board or a package. In some embodiments, as shown in FIG. 5, the conductive elements 142 of the package structure 10 in the package-on-package structure 20 are bonded to the conductive pads 302 (such as bonding pads) to provide electrical connections between the package component 300 and the package-on-package structure 20. That is to say, the package-on-package structure 20 is physically and electrically connected to the package component 300. In some embodiments, an underfill (not shown) may be applied to fill the gap between the package-on-package structure 20 and the package component 300 to protect the conductive elements 142 and the conductive pads 140, which enhances the bonding strength between the package-on-package structure 20 and the package component 300; thereby improving the reliability of the package structure depicted in FIG. 5.

Figure 6:
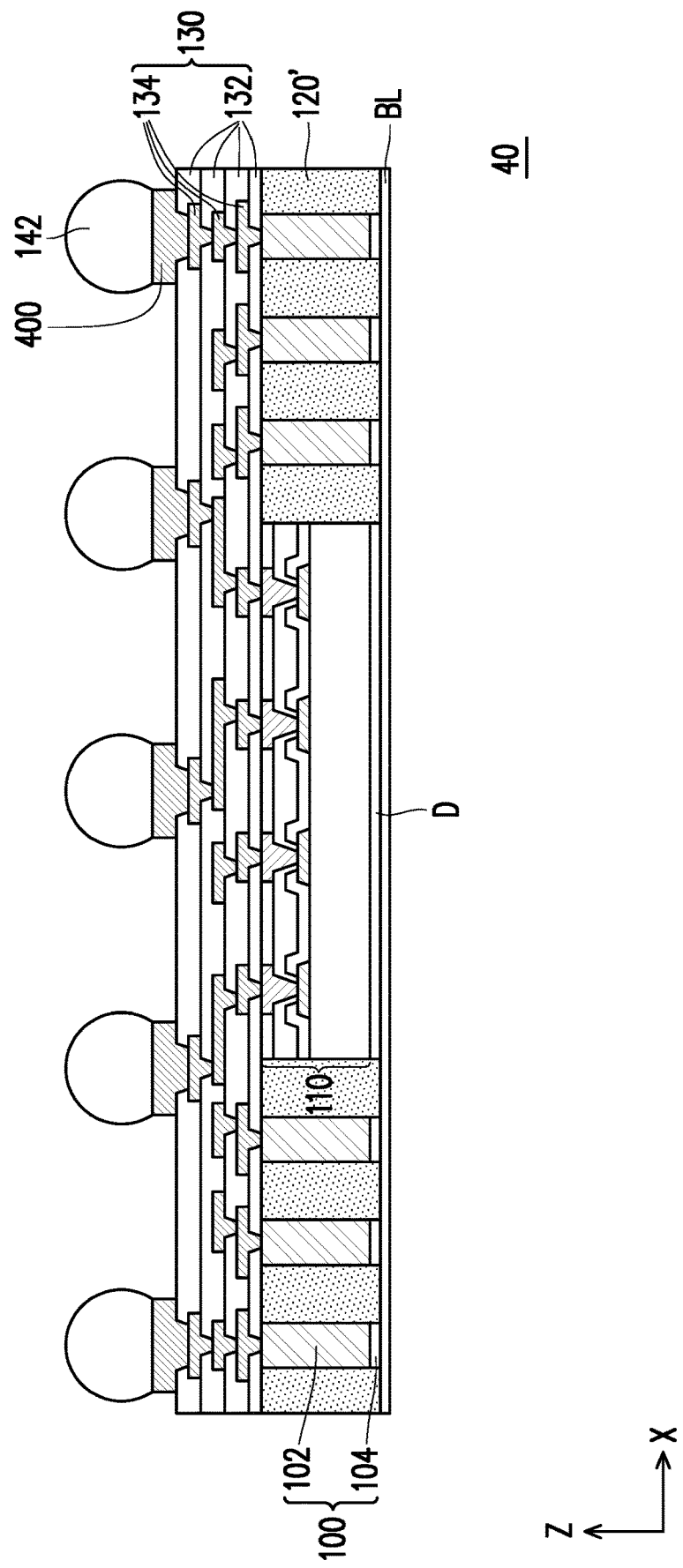
FIG. 6 is a schematic sectional view of a package structure in accordance with some alternative embodiments of the disclosure.

FIG. 6 is a schematic sectional view of a package structure in accordance with some alternative embodiments of the disclosure. The package structure 40 illustrated in FIG. 6 is similar to the package structure 10 illustrated in FIG. 1L, hence the same reference numerals are used to refer to the same or liked parts, and its detailed description will be omitted herein. The differences between the package structure 40 illustrated in FIG. 6 and the package structure 10 illustrated in FIG. 1L will be described below.

Referring to FIG. 6, in the package structure 40, the conductive pillars 400 are disposed on an exposed top surface of the topmost layer of the conductive layers 134. In some embodiments, the material of the conductive pillars 400, for example, may include a conductive material such as copper, aluminum, titanium, nickel, tungsten, tin, solder or a combination thereof. In certain embodiments, the conductive pillars 400 may be plated copper pillars. Furthermore, referring to both FIG. 6 and FIG. 1L, the conductive pillars 400 are used in replacement of the conductive pads 140 for providing electrical connection between the conductive elements 142 and the redistribution layer 130.

In the package structure 10 illustrated in FIG. 1L, only one die 110 is disposed between the conductive through vias 100. However, the disclosure is not limited thereto. In some alternative embodiments, more than one die 110 may be disposed between the conductive through vias 100. Hereinafter, other embodiments will be described with reference to FIG. 7.

Figure 7:
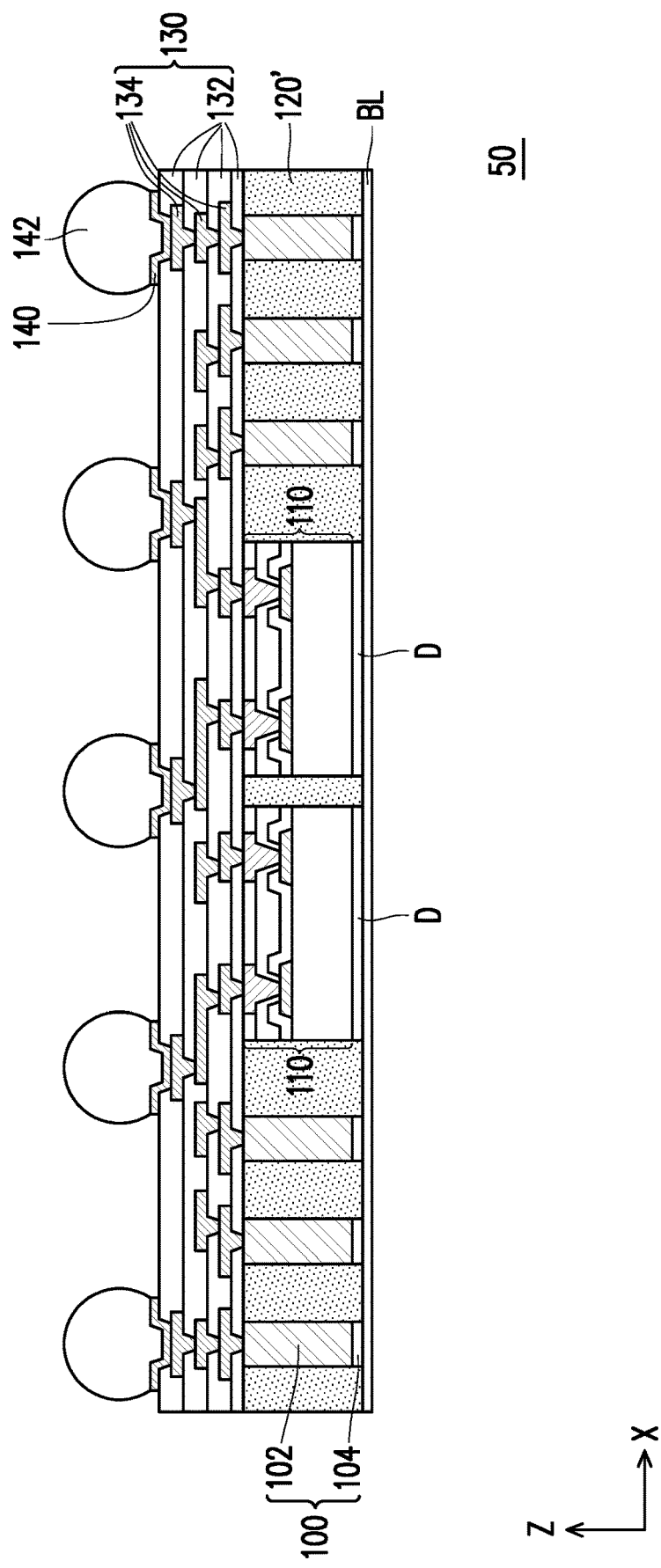
FIG. 7 is a schematic sectional view of a package structure in accordance with some alternative embodiments of the disclosure.

FIG. 7 is a schematic sectional view of a package structure in accordance with some alternative embodiments of the disclosure. The package structure 50 illustrated in FIG. 7 is similar to the package structure 10 illustrated in FIG. 1L, hence the same reference numerals are used to refer to the same or liked parts, and its detailed description will be omitted herein. Referring to FIG. 7 and FIG. 1L, the differences between the package structure 50 illustrated in FIG. 7 and the package structure 10 illustrated in FIG. 1L lies in that two dies 110 are disposed between the conductive through vias 100 in the package structure 50. However, the disclosure is not limited thereto. In some alternative embodiments, more number of dies 110 may be formed based on design requirement.

Figure 8:
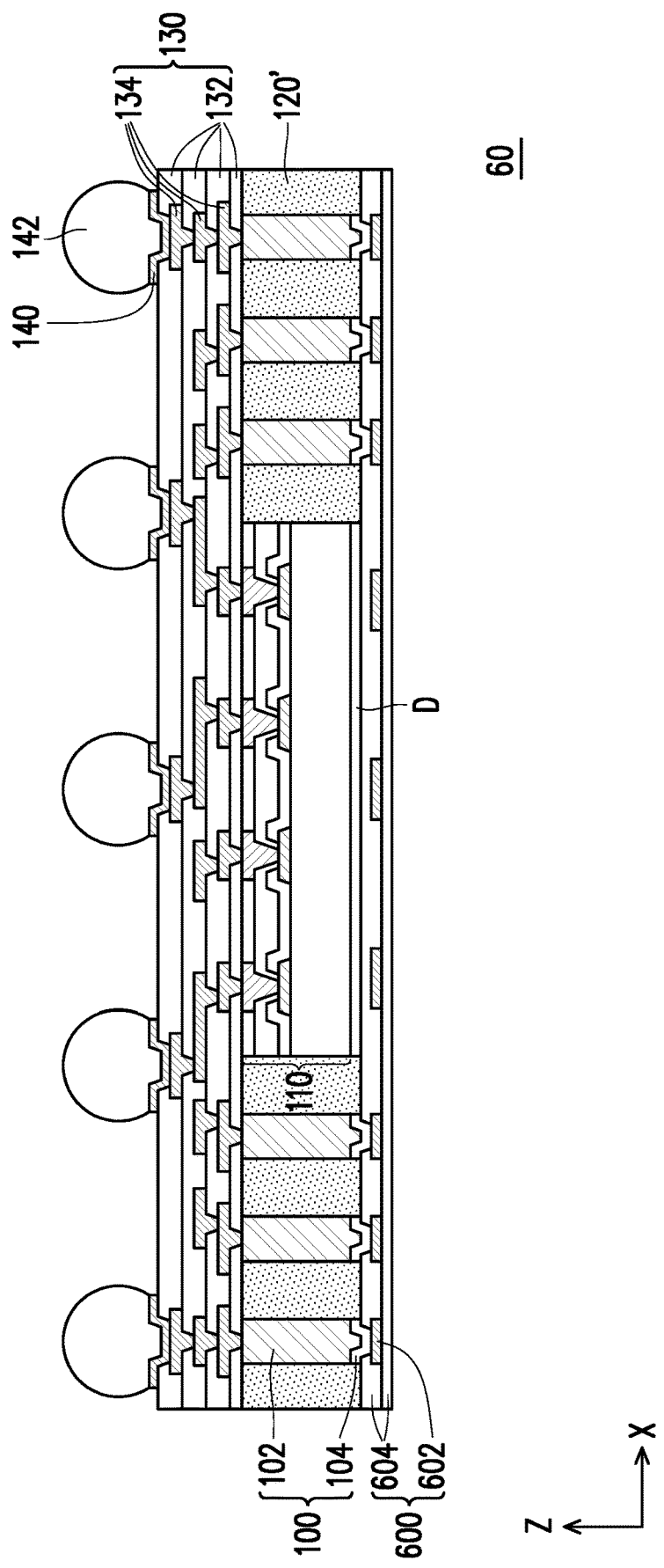
FIG. 8 is a schematic sectional view of a package structure in accordance with some alternative embodiments of the disclosure.

FIG. 8 is a schematic sectional view of a package structure in accordance with some alternative embodiments of the disclosure. The package structure 60 illustrated in FIG. 8 is similar to the package structure 10 illustrated in FIG. 1L, hence the same reference numerals are used to refer to the same or liked parts, and its detailed description will be omitted herein. The differences between the package structure 60 illustrated in FIG. 8 and the package structure 10 illustrated in FIG. 1L will be described below.

Referring to FIG. 8, another redistribution layer 600 is included in the package structure 60. In some embodiments, as shown in FIG. 8, the redistribution layer 600 and the redistribution layer 130 are respectively disposed on two opposite surfaces of the encapsulant 120'. That is to say, the die 110 is disposed between the redistribution layer 600 and the redistribution layer 130. In some embodiments, as shown in FIG. 8, the formation of the redistribution layer 600 includes sequentially forming one or more dielectric layers 602 and one or more conductive layers 604 in alternation. Although FIG. 8 illustrates that the redistribution layer 600 includes two dielectric layers 602 and one conductive layer 604, where the conductive layer 604 is sandwiched between the dielectric layers 602, the disclosure is not limited thereto. In other embodiments, the number of the dielectric layers 602 and the number of the conductive layer 604 may be adjusted based on product requirement. In some embodiments, the conductive through vias 100 are electrically connected to the conductive layer 604 of the redistribution layer 600. That is to say, in the package structure 60, the conductive through vias 100 may used to provide electrical connections between the redistribution layer 130 and the redistribution layer 600. In some embodiments, the materials of the dielectric layer 602 and the conductive layer 604 of the redistribution layer 600 is similar to the materials of the dielectric layer 132 and the conductive layer 134 mentioned for the redistribution layer 130. Therefore, the detailed descriptions of the dielectric layer 602 and the conductive layer 604 will be omitted herein. Furthermore, referring to both FIG. 8 and FIG. 1L, the redistribution layer 600 is disposed on the encapsulant 120' in replacement of the buffer layer BL.

Figure 9:
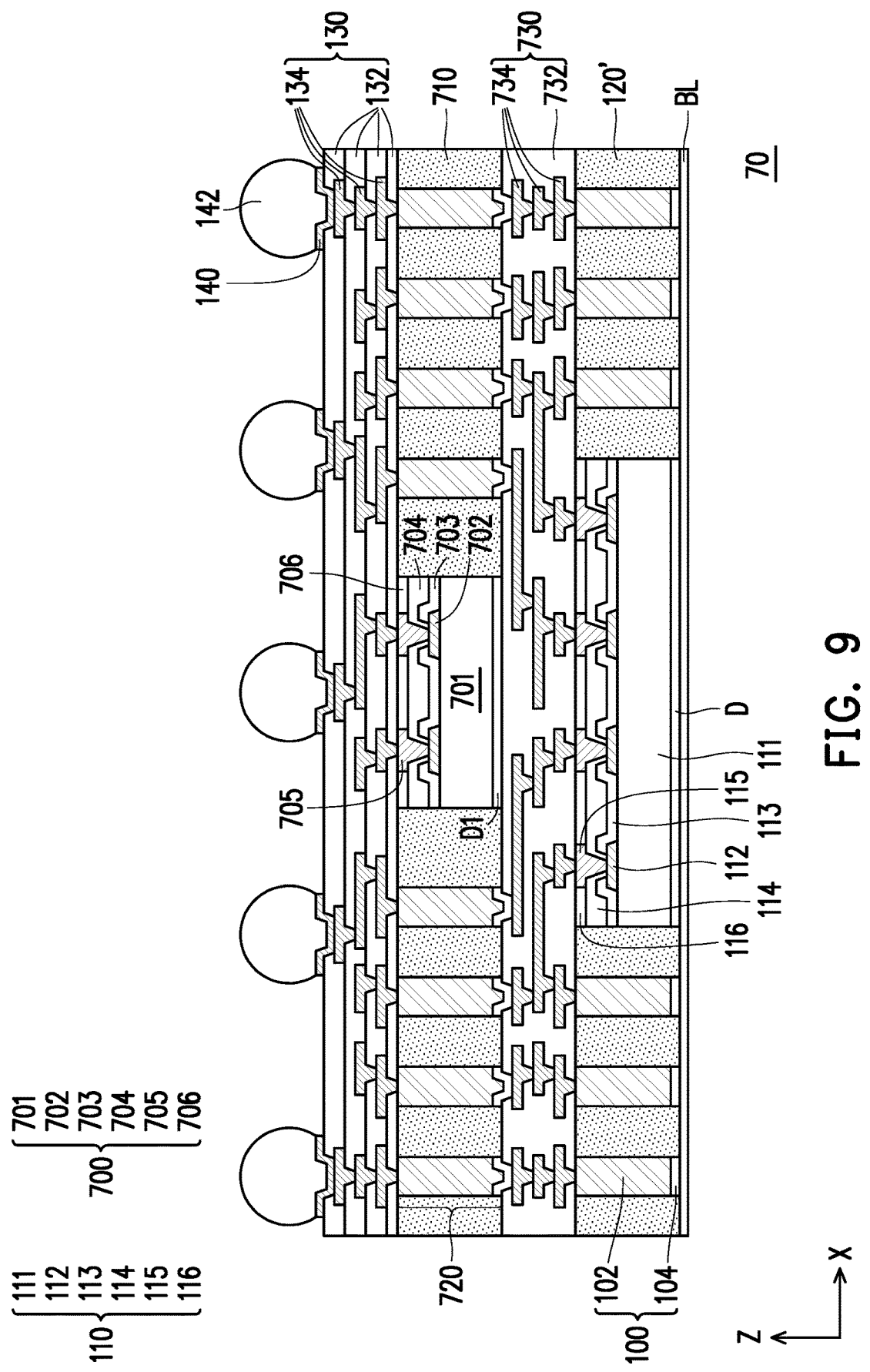
FIG. 9 is a schematic sectional view of a package structure in accordance with some alternative embodiments of the disclosure.

FIG. 9 is a schematic sectional view of a package structure in accordance with some alternative embodiments of the disclosure. The package structure 70 illustrated in FIG. 9 is similar to the package structure 10 illustrated in FIG. 1L, hence the same reference numerals are used to refer to the same or liked parts, and its detailed description will be omitted herein. The differences between the package structure 70 illustrated in FIG. 9 and the package structure 10 illustrated in FIG. 1L will be described below.

Referring to both FIG. 9 and FIG. 1L, the main difference between the package structure 70 and the package structure 10 lies in that a die 700 is further included in the package structure 70. In the exemplary embodiment, the die 700 includes a semiconductor substrate 701, a plurality of conductive pads 702, a passivation layer 703, a post-passivation layer 704, a plurality of conductive pillars 705, and a protection layer 706. These elements of the die 700 may be similar to the semiconductor substrate 111, the conductive pads 112, the passivation layer 113, the post-passivation layer 114, the conductive pillars 115, and the protection layer 116 of the die 110, hence the detailed descriptions of the said elements of the die 700 may be referred thereto. Briefly, the conductive pads 702 are located on the semiconductor substrate 701, the passivation layer 703 and the post-passivation layer 704 are sequentially located on the semiconductor substrate 701 and the conductive pads 702, the protection layer 706 is located on the post-passivation layer 704, the conductive pillars 705 are embedded in the post-passivation layer 704 and the protection layer 706, and the conductive pillars 705 are electrically connected with the conductive pads 702. As illustrated in FIG. 9, the die 700 is located over the die 110 along the direction Z.

In some embodiments, as shown in FIG. 9, an encapsulant 710 is formed to encapsulate the die 700. The encapsulant 710 may be similar to the encapsulant 120', hence the detailed descriptions of the encapsulant 710 may be referred thereto. In some embodiments, as shown in FIG. 9, conductive through vias 720 are embedded within the encapsulant 710. The conductive through vias 720 may be similar to the conductive through vias 100, hence the detailed descriptions of the conductive through vias 720 may be referred thereto. Briefly, as mentioned above, by applying the stripping solution including the alkaline compound and the non-dimethyl sulfoxide solvent containing the aprotic solvent and the protic solvent in the stripping process, the conductive through vias 720 having high aspect ratio can be formed with significantly improved manufacturing yield. Also, as mentioned above, by applying the stripping solution including the alkaline compound and the non-dimethyl sulfoxide solvent containing the aprotic solvent and the protic solvent in the stripping process, the conductive through vias 720 can be formed to have high distribution density.

In some embodiments, as shown in FIG. 9, an interconnection layer 730 is disposed between the encapsulant 710 and the encapsulant 120'. In some embodiments, the interconnection layer 730 includes an inter-dielectric layer 732 and a plurality of conductive layers 734. In some embodiments, the conductive layers 734 are embedded in the inter-dielectric layer 732. For simplicity, the inter-dielectric layer 732 is illustrated as a bulky layer in FIG. 9, but it should be understood that the inter-dielectric layer 732 may be constituted by multiple dielectric layers, and the number of the dielectric layers in the inter-dielectric layer 732 may be adjusted depending on product requirement. Further, the conductive layers 734 and the dielectric layers of the inter-dielectric layer 732 may be stacked alternately. It should be noted that the number of the conductive layers 734 shown in FIG. 9 is merely an illustration, and the disclosure is not limited. In some alternative embodiments, the number of the conductive layers 734 may be adjusted based on product requirement.

In some embodiments, the material of the inter-dielectric layer 732 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the material of the inter-dielectric layer 732 may be formed by suitable fabrication techniques such as spin-on coating, CVD, HDPCVD, PECVD, ALD or the like. In some embodiments, the material of the conductive layers 734 may be made of conductive materials formed by electroplating or deposition, such as aluminum, titanium, copper, nickel, tungsten, and/or alloys thereof, which may be patterned using a photolithography and etching process. In some embodiments, the conductive layers 734 may be patterned copper layers or other suitable patterned metal layers.

In some embodiments, as shown in FIG. 9, the interconnection layer 730 is electrically connected to the conductive through vias 100, the conductive pillars 115 of the die 110, and the conductive through vias 720. In some embodiments, the die 110 is electrically connected to the conductive through vias 100 through the interconnection layer 730. In some embodiments, as shown in FIG. 9, the die 700 is attached (or adhered) to the inter-dielectric layer 732 in the interconnection layer 730 through a bonding film D1. In some embodiments, the bonding film D1 may be an adhesive film, such as a die attach film (DAF). In some alternative embodiments, the bonding film D1 may be any materials used for fusion bonding. For example, the bonding film D1 may be an oxide-based film (e.g., silicon oxide film) used for oxide-oxide fusion bonding. In some embodiments, as shown in FIG. 9, the redistribution layer 130 is electrically connected to the conductive pillars 705 of the die 700, and the conductive through vias 720. Furthermore, in some embodiments, the die 110 and the die 700 may be in different sizes (e.g., different heights and/or surface areas). In some alternative embodiments, the die 110 and the die 700 may be in the same size (e.g., same heights and/or surface areas).

Figure 10:
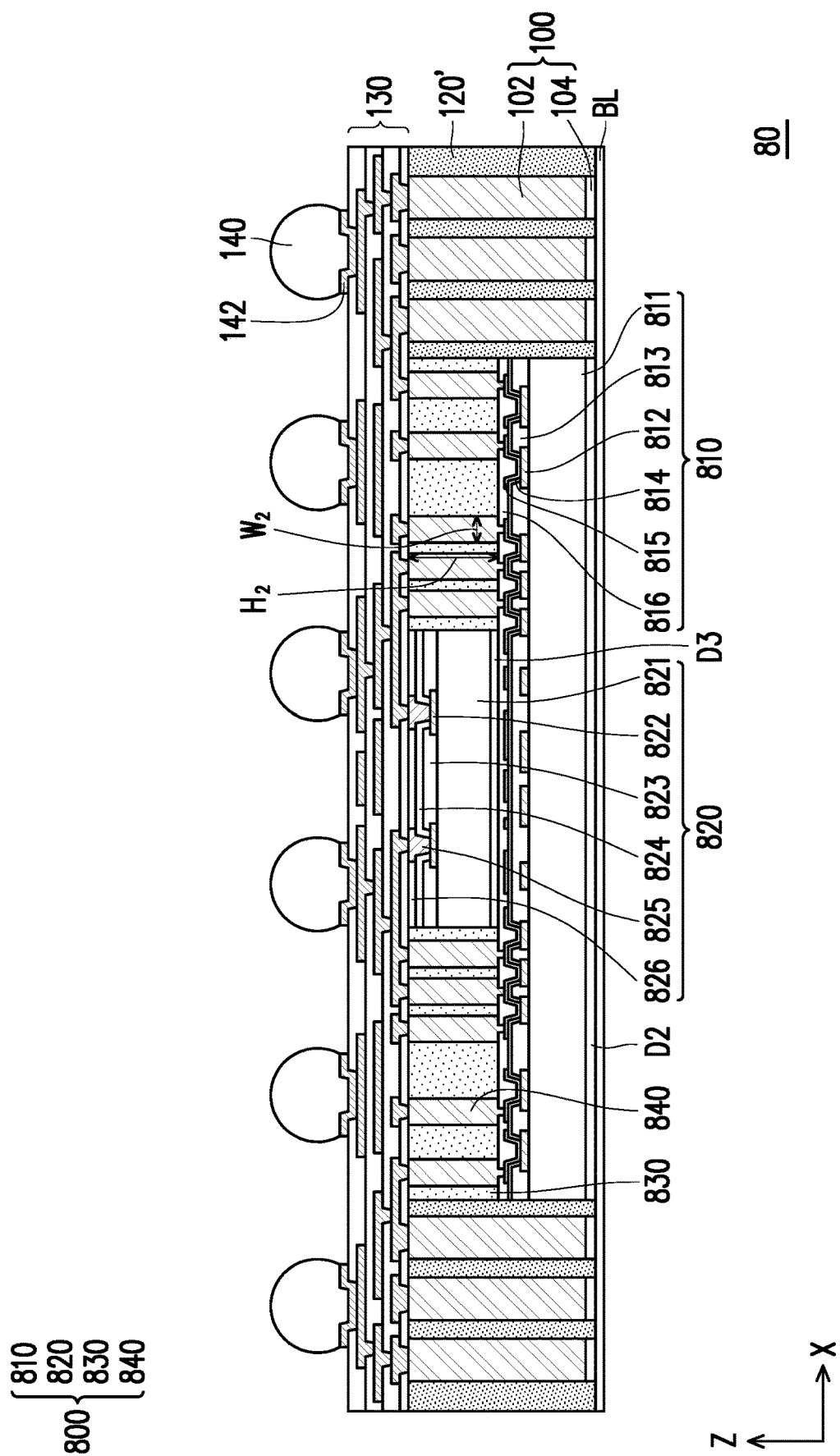
FIG. 10 is a schematic sectional view of a package structure in accordance with some alternative embodiments of the disclosure.

FIG. 10 is a schematic sectional view of a package structure in accordance with some alternative embodiments of the disclosure. The package structure 80 illustrated in FIG. 10 is similar to the package structure 10 illustrated in FIG. 1L, hence the same reference numerals are used to refer to the same or liked parts, and its detailed description will be omitted herein. The differences between the package structure 80 illustrated in FIG. 10 and the package structure 10 illustrated in FIG. 1L will be described below.

Referring to both FIG. 10 and FIG. 1L, the main difference between the package structure 80 and the package structure 10 lies in that the die 110 is omitted from the package structure 80. In detail, referring to both FIG. 10 and FIG. 1L, a package 800 is encapsulated by the encapsulant 120' in replacement of the die 110. In the exemplary embodiment, the package 800 includes a first die 810, a second die 820, an encapsulant 830 and conductive through vias 840. As illustrated in FIG. 10, the second die 820 is stacked on the first die 810 along the direction Z. In other words, multiple dies 810, 820 are integrated into a single package 800. As such, the package 800 may be referred to as a "system on integrated circuit (SOIC) package." In some embodiments, as shown in FIG. 10, the package 800 is attached (or adhered) to the buffer layer BL through a bonding film D2. In some embodiments, the bonding film D2 may be an adhesive film, such as a die attach film (DAF). In some alternative embodiments, the bonding film D2 may be any materials used for fusion bonding. For example, the bonding film D2 may be an oxide-based film (e.g., silicon oxide film) used for oxide-oxide fusion bonding.

In some embodiments, the first die 810 may include a semiconductor substrate 811, a plurality of conductive pads 812, a passivation layer 813, a post-passivation layer 814, a conductive layer 815, and a dielectric layer 816, as shown in FIG. 10. The semiconductor substrate, the conductive pads 812, the passivation layer 813 and the post-passivation layer 814 of the first die 810 may be similar to the semiconductor substrate 111, the conductive pads 112, the passivation layer 113 and the post-passivation layer 114 of the die 110, hence the detailed descriptions of the said elements may be referred thereto. Briefly, the conductive pads 812 are located on the semiconductor substrate 811, and the passivation layer 813 and the post-passivation layer 814 are sequentially located on the semiconductor substrate 811 and the conductive pads 812. In some embodiments, as shown in FIG. 10, the conductive layer 815 is disposed on the post-passivation layer 814 and electrically connected with the conductive pads 812 through the contact openings of the post-passivation layer 814. In some embodiments, the material of the conductive layer 815, for example, may include a conductive material such as copper, aluminum, titanium, nickel, tungsten, tin, solder, or a combination thereof. In some embodiments, the conductive layer 815 may be formed by, for example, electroplating, deposition, and/or photolithography and etching. In some embodiments, as shown in FIG. 10, the dielectric layer 816 is disposed on the conductive layer 815. In some embodiments, the material of the dielectric layer 816 may be PI, PBO, BCB, a nitride such as silicon nitride, an oxide such as silicon oxide, PSG, BSG, BPSG, a combination thereof or the like, which may be patterned using a photolithography and/or etching process. In some embodiments, the material of the dielectric layer 816 may be formed by suitable fabrication techniques such as spin-on coating, CVD, HDPCVD, PECVD, atomic layer deposition (ALD) or the like. The illustrated top surface of the dielectric layer 816, which is opposite to the illustrated bottom surface contacting the conductive layer 815, may be levelled and may have a high degree of planarity.

In some embodiments, the second die 820 may include a semiconductor substrate 821, a plurality of conductive pads 822, a passivation layer 823, a post-passivation layer 824, a plurality of conductive pillars 825, and a protection layer 826, as shown in FIG. 10. These elements of the second die 820 may be similar to the semiconductor substrate 111, the conductive pads 112, the passivation layer 113, the post-passivation layer 114, the conductive pillars 115, and the protection layer 116 of the die 110, hence the detailed descriptions of the said elements of the second die 820 may be referred thereto. Briefly, the conductive pads 822 are located on the semiconductor substrate 821, the passivation layer 823 and the post-passivation layer 824 are sequentially located on the semiconductor substrate 821 and the conductive pads 822, the protection layer 826 is located on the post-passivation layer 824, the conductive pillars 825 are embedded in the post-passivation layer 824 and the protection layer 826, and the conductive pillars 825 are electrically connected with the conductive pads 822. Moreover, in some embodiments, as shown in FIG. 10, the second die 820 is attached (or adhered) to the dielectric layer 816 on first die 810 through a bonding film D3. In some embodiments, the bonding film D3 may be an adhesive film, such as a die attach film (DAF). In some alternative embodiments, the bonding film D3 may be any materials used for fusion bonding. For example, the bonding film D3 may be an oxide-based film (e.g., silicon oxide film) used for oxide-oxide fusion bonding.

In some embodiments, as shown in FIG. 10, an encapsulant 830 is formed to encapsulate the die 820. The encapsulant 830 may be similar to the encapsulant 120', hence the detailed descriptions of the encapsulant 830 may be referred thereto. In some embodiments, as shown in FIG. 10, conductive through vias 840 are embedded within the encapsulant 830. In some embodiments, each conductive through via 840 is formed to have a round top-view shape. However, the disclosure is not limited thereto. In some alternative embodiments, each conductive through via 840 may exhibit a polygonal shape or other suitable shapes from the top view. In some embodiments, in the direction Z, a height $H_2$ of each conductive through via 840 ranges between about 15 μm and about 360 μm. In some embodiments, in the direction X perpendicular the direction Z, a width $W_2$ of each conductive through via 840 ranges between about 5 μm and about 120 μm. In the case that each conductive through via 840 has a round top-view shape, then the width $W_2$ may be the diameter. In the case that each conductive through via 840 has a polygonal shape from the top view, then the width $W_2$ may be the maximum dimension. In some embodiments, an aspect ratio (i.e., a ratio of the height $H_2$ to the width $W_2$) of each conductive through via 840 is in a range from more than about 3 to about 15. According to the descriptions with respect to FIGS. 1A-1L, and 3A-3E, it may be deduced that the method described above in conjunction with FIGS. 3A-3E can be applied to the manufacturing process of any package structure that includes conductive through vias, even the conductive through vias having high aspect ratio. As such, those skilled in the art should understand that the method described above in conjunction with FIGS. 3A-3E can be applied to manufacture the conductive through vias 840, thereby whether the conductive through vias 840 have high aspect ratio or not, the conductive through vias 840 can be formed with significantly improved manufacturing yield. However, the disclosure is not limited thereto.

In some embodiments, as shown in FIG. 10, the conductive through vias 840 is electrically connected to the conductive layer 815 of the first die 810. In some embodiments, as shown in FIG. 10, the redistribution layer 130 is electrically connected to the conductive through vias 100, the conductive pillars 825 of the second die 820, and the conductive through vias 840. In some embodiments, the second die 820 is electrically connected to the first die 810 through the redistribution layer 130 and the conductive through vias 840. In some embodiments, the package 800 is electrically connected to the conductive through vias 100 through the redistribution layer 130.

Figure 11:
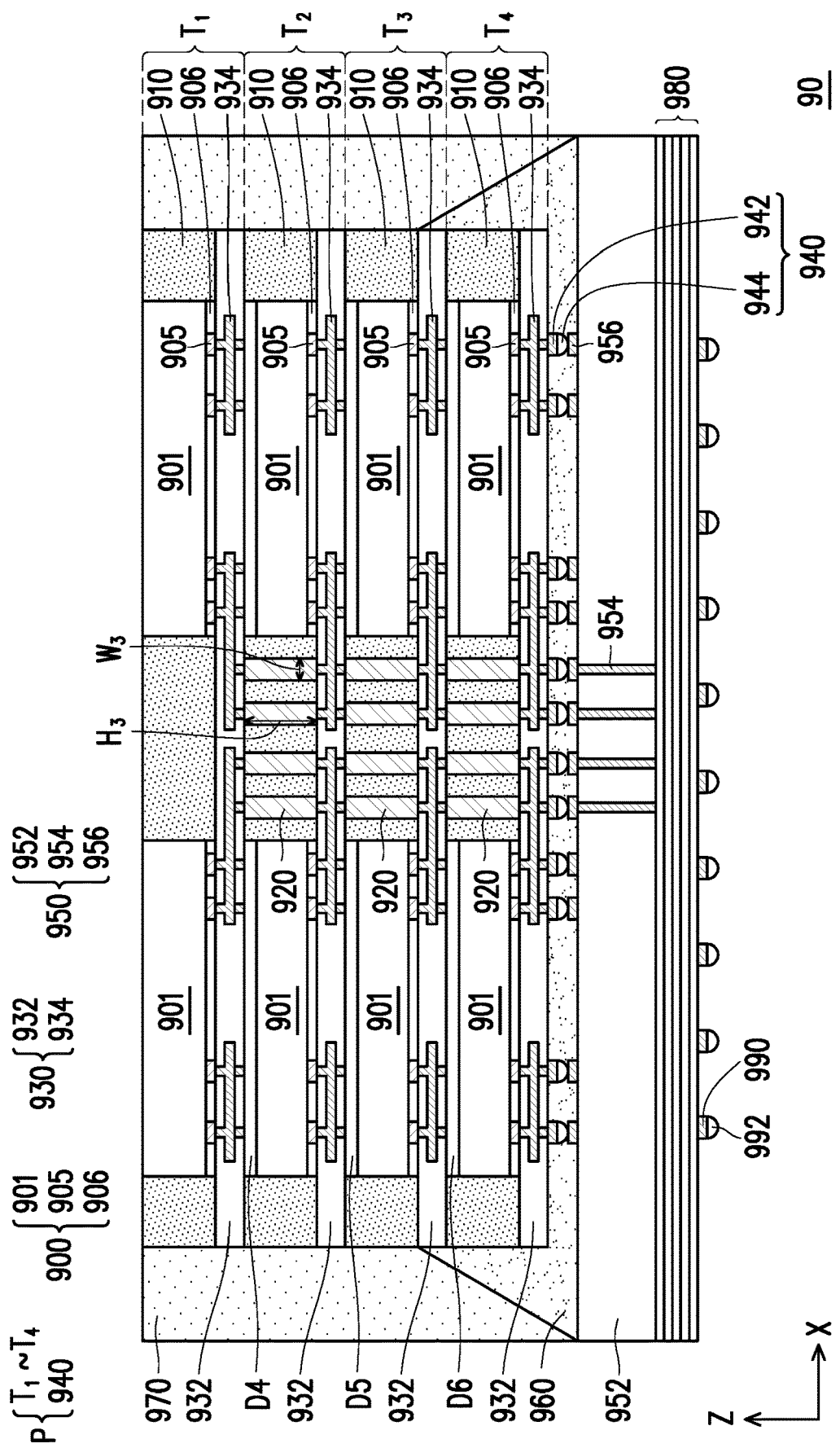
FIG. 11 is a schematic sectional view of a package structure in accordance with some alternative embodiments of the disclosure.

FIG. 11 is a schematic sectional view of a package structure in accordance with some alternative embodiments of the disclosure.

Referring to FIG. 11, a package structure 90 may include a package P, a carrier die 950, an underfill 960, an encapsulant 970, a redistribution layer 980, a plurality of conductive pads 990 and a plurality of conductive elements 992. In the exemplary embodiment, the package P includes a tier structure $T_1$, a tier structure $T_2$, a tier structure $T_3$, a tier structure $T_4$, and a plurality of conductive terminals 940. Although FIG. 11 illustrates that the package P includes four tier structures (i.e., the tier structures $T_1$ to $T_4$), the disclosure is not limited thereto. In other embodiments, the number of the tier structures in the package P may be adjusted based on product requirement.

As illustrated in FIG. 11, each of the tier structure $T_1$, the tier structure $T_2$, the tier structure $T_3$ and the tier structure $T_4$ includes dies 900, an encapsulant 910 and a redistribution layer 930. Further, as illustrated in FIG. 11, each of the tier structure $T_2$, the tier structure $T_3$ and the tier structure $T_4$ includes conductive through vias 920. In some embodiments, as shown in FIG. 11, each die 900 may include a semiconductor substrate 901, a plurality of conductive pillars 905, and a protection layer 906. These elements of the die 900 may be similar to the semiconductor substrate 111, the conductive pillars 115, and the protection layer 116 of the die 110, hence the detailed descriptions of the said elements of the die 900 may be referred thereto. In some embodiments, each die 900 may further include an interconnect structure (not shown), conductive pads (not shown), a passivation layer (not shown), and a post-passivation layer (not shown). In some embodiments, each die 900 may be a memory die (e.g., a DRAM die, a SRAM die, a synchronous dynamic random access memory (SDRAM), a NAND flash, etc.). Although FIG. 11 illustrates that each of the tier structure $T_1$, the tier structure $T_2$, the tier structure $T_3$ and the tier includes two dies 900, the disclosure is not limited thereto. In other embodiments, the number of the dies 900 included in a tier structure may be adjusted based on product requirement. Moreover, as shown in FIG. 11, the tier structure $T_1$ includes two separated dies 900. However, the disclosure is not limited thereto. In some alternative embodiments, the tier structure $T_1$ may include a single one die 900.

In some embodiments, as shown in FIG. 11, in each of the tier structure $T_1$, the tier structure $T_2$, the tier structure $T_3$ and the tier structure $T_4$, the encapsulant 910 is formed to encapsulate the dies 900. The encapsulant 910 may be similar to the encapsulant 120', hence the detailed descriptions of the encapsulant 910 may be referred thereto.

In some embodiments, as shown in FIG. 11, in each of the tier structure $T_2$, the tier structure $T_3$ and the tier structure $T_4$, the conductive through vias 920 are embedded within the encapsulant 910. In some embodiments, each conductive through via 904 is formed to have a round top-view shape. However, the disclosure is not limited thereto. In some alternative embodiments, each conductive through via 904 may exhibit a polygonal shape or other suitable shapes from the top view. In some embodiments, in the direction Z, a height $H_3$ of each conductive through via 904 ranges between about 15 μm and about 360 μm. In some embodiments, in the direction X perpendicular the direction Z, a width $W_3$ of each conductive through via 904 ranges between about 5 μm and about 120 μm. In the case that each conductive through via 904 has a round top-view shape, then the width $W_3$ may be the diameter. In the case that each conductive through via 904 has a polygonal shape from the top view, then the width $W_3$ may be the maximum dimension. In some embodiments, an aspect ratio (i.e., a ratio of the height $H_3$ to the width $W_3$) of each conductive through via 904 is more than about 3, i.e., the conductive through vias 920 are formed to have high aspect ratio. According to the descriptions with respect to FIGS. 1A-1L, and 3A-3E, it may be deduced that the method described above in conjunction with FIGS. 3A-3E can be applied to the manufacturing process of any package structure that includes conductive through vias having high aspect ratio. Accordingly, those skilled in the art should understand that the method described above in conjunction with FIGS. 3A-3E can be applied to manufacture the conductive through vias 920, thereby the conductive through vias 920 having high aspect ratio can be formed with significantly improved manufacturing yield.

In some embodiments, as shown in FIG. 11, in each of the tier structure $T_1$, the tier structure $T_2$, the tier structure $T_3$ and the tier structure $T_4$, the redistribution layer 930 is formed on the encapsulant 910 and the dies 900. In the exemplary embodiment, the redistribution layer 930 includes a dielectric layer 932 and a plurality of conductive layers 934. These elements of the redistribution layer 930 may be similar to the dielectric layers 132 and the conductive layers 134 of the redistribution layer 130, hence the detailed descriptions of the said elements of the redistribution layer 930 may be referred thereto. For simplicity, the dielectric layer 932 is illustrated as a bulky layer in FIG. 11, but it should be understood that the dielectric layer 932 may be constituted by multiple dielectric layers, and the number of the dielectric layers in the dielectric layer 932 may be adjusted depending on product requirement. Further, the conductive layers 934 and the dielectric layers of the dielectric layer 932 may be stacked alternately. It should be noted that the number of the conductive layers 934 shown in FIG. 11 is merely an illustration, and the disclosure is not limited. In some alternative embodiments, the number of the conductive layers 934 may be adjusted based on product requirement.

In some embodiments, as shown in FIG. 11, the redistribution layer 930 of the tier structure $T_1$ is electrically connected to the dies 900 of the tier structure $T_1$ and the conductive through vias 920 of the tier structure $T_2$; the redistribution layer 930 of the tier structure $T_2$ is electrically connected to the dies 900 of the tier structure $T_2$, the conductive through vias 920 of the tier structure $T_2$ and the conductive through vias 920 of the tier structure $T_3$; the redistribution layer 930 of the tier structure $T_3$ is electrically connected to the dies 900 of the tier structure $T_3$, the conductive through vias 920 of the tier structure $T_3$ and the conductive through vias 920 of the tier structure $T_4$; the redistribution layer 930 of the tier structure T is electrically connected to the dies 900 of the tier structure $T_4$ and the conductive through vias 920 of the tier structure $T_4$. In some embodiments, as shown in FIG. 11, each die 900 in the tier structure $T_2$ is attached (or adhered) to the redistribution layer 930 of the tier structure $T_1$ through a bonding film D4; each die 900 in the tier structure $T_3$ is attached (or adhered) to the redistribution layer 930 of the tier structure $T_2$ through a bonding film D5; each die 900 in the tier structure $T_4$ is attached (or adhered) to the redistribution layer 930 of the tier structure $T_3$ through a bonding film D6. In some embodiments, each of the bonding film D4, the bonding film D5 and the bonding film D6 may be an adhesive film, such as a die attach film (DAF). In some alternative embodiments, each of the bonding film D4, the bonding film D5 and the bonding film D6 may be any materials used for fusion bonding. For example, each of the bonding film D4, the bonding film D5 and the bonding film D6 may be an oxide-based film (e.g., silicon oxide film) used for oxide-oxide fusion bonding.

In some embodiments, as shown in FIG. 11, the conductive terminals 940 are formed at the exposed surfaces of the redistribution layer 930 in the tier structure $T_1$. The conductive terminals 940 may be formed by using, for example, a sputtering, printing, plating, deposition, or the like. The conductive terminals 940 may be formed of conductive material(s) including copper, aluminum, gold, nickel, silver, palladium, tin, solder, metal alloy, the like, or combinations thereof. In the exemplary embodiment, each of the conductive terminals 940 includes a bump 942 and a metal cap 944 formed on the bump 942, as shown in FIG. 11. The bump 942 may be a micro-bump, a metal pillar, an ENEPIG formed bump, a C4 bump, a BGA bump, or the like. In an embodiment in which the bumps 942 are micro-bumps, a bump pitch between two adjacent bumps 942 ranges from about 20 μm to about 140 μm. The bumps 31 may be solder free and may have substantially vertical sidewalls. In some embodiments, the metal cap 32 is formed by, for example, plating, printing, or the like. For example, the material of the metal caps 944 includes nickel, tin, tin-lead, gold, silver, palladium, nickel-palladium-gold, nickel-gold, the like, or any combination of these.

In some embodiments, the carrier die 950 may be a logic die (e.g., CPU, microcontroller, a system-on-a-chip (SoC), a graphics processing unit (GPU), etc.). In some embodiments, the carrier die 950 may be used to provide control functionality for the dies 900 in the tier structures $T_1$ to $T_4$. In the exemplary embodiment, the carrier die 950 includes a semiconductor substrate 952, a plurality of conductive through vias 954 and a plurality of conductive pads 956. The semiconductor substrate 952 may be similar to the semiconductor substrate 111 of the die 110, hence the detailed descriptions of the semiconductor substrate 952 may be referred thereto. As illustrated in FIG. 11, the conductive through vias 954 penetrate the semiconductor substrate 952. The conductive through vias 954 may be formed by the following steps. First, openings are formed in the semiconductor substrate 952 by, for example, etching, milling, laser techniques, or a combination thereof. Then, a thin dielectric material may be formed in the openings by using, for example, an oxidation technique. A barrier layer may then be conformally deposited over the semiconductor substrate 952 and in the openings. The material of the barrier layer may include a nitride or an oxynitride, such as titanium nitride, titanium oxynitride, tantalum nitride, tantalum oxynitride, tungsten nitride, or a combination thereof. Next, a conductive material may be deposited over the barrier layer and in the openings. The conductive material may be formed by an electro-chemical plating process, CVD, ALD, PVD, or a combination thereof. Examples of the conductive material are copper, tungsten, aluminum, silver, gold, or a combination thereof. Afterward, the conductive material and the barrier layer outside the openings are removed from the semiconductor substrate 952 by, for example, CMP. Thus, the conductive through vias 954 may include a conductive material and a barrier layer between the conductive material and the semiconductor substrate 952.

In some embodiments, as shown in FIG. 11, the conductive terminals 940 of the package P are physically connecting the conductive pads 956 (such as bonding pads) of the carrier die 950 by flip-chip bonding to provide electrical connections between the package P and the carrier die 950. That is to say, the package P is physically and electrically connected to the carrier die 950 through the conductive terminals 940 and the conductive pads 956. In some embodiments, as shown in FIG. 11, the conductive through vias 954 are electrically connected to the conductive pads 956.

In some embodiments, as shown in FIG. 11, the underfill 960 is provided to fill the gap between the package P and the carrier die 950. As shown in FIG. 11, the underfill 960 may extend up along the sidewall of the package P. Owing to the underfill 960, a bonding strength between the package P and the carrier die 950 are enhanced, thereby improving the reliability of the package structure 90 depicted in FIG. 11. In some embodiments, as shown in FIG. 11, the encapsulant 970 is formed to encapsulate the package P and the underfill 960. The encapsulant 970 may be similar to the encapsulant 120', hence the detailed descriptions of the encapsulant 970 may be referred thereto.

In some embodiments, as shown in FIG. 11, the redistribution layer 980 is formed on the semiconductor substrate 952 of the carrier die 950 and opposite to the package P. The redistribution layer 980 may be formed in a manner similar to the redistribution layer 130, hence the detailed descriptions of the redistribution layer 980 may be referred thereto. In some embodiments, as shown in FIG. 11, the conductive pads 990 and the conductive elements 992 are formed on the redistribution layer 980 and opposite to the carrier die 950. The conductive pads 990 and the conductive elements 992 may be similar to the conductive pads 140 and the conductive elements 142, hence the detailed descriptions of the conductive pads 990 and the conductive elements 992 may be referred thereto. In some embodiments, the redistribution layer 980 is used to provide electrical connections between the conductive pads 990 and the conductive through vias 954.

In accordance with some embodiments of the disclosure, a method for removing a resist layer including the following steps is provided. A patterned resist layer on a material layer is formed. A stripping solution is applied to the patterned resist layer to dissolve the patterned resist layer without dissolving the material layer, wherein the stripping solution comprises a non-dimethyl sulfoxide solvent and an alkaline compound, the non-dimethyl sulfoxide solvent comprises an aprotic solvent and a protic solvent.

In accordance with some alternative embodiments of the disclosure, a method of manufacturing a semiconductor structure including the following steps is provided. A seed layer is formed. A patterned mask layer is formed on the seed layer, wherein the patterned mask layer has openings exposing the seed layer. Metal patterns are formed in the openings. A stripping process is performed to the patterned mask layer by applying a stripping solution to break the patterned mask layer into pieces and dissolve the pieces of the patterned mask layer in the stripping solution, wherein the stripping solution comprises a non-dimethyl sulfoxide solvent and an alkaline compound, the non-dimethyl sulfoxide solvent comprises an aprotic solvent and a protic solvent.

In accordance with some alternative embodiments of the disclosure, a method of manufacturing a semiconductor structure including the following steps is provided. Conductive through vias are formed on a carrier. A die is provided on the carrier. The die and the conductive through vias are laterally encapsulated with an encapsulant, wherein forming the conductive through vias on the carrier includes: sequentially forming a seed layer and a resist layer on the carrier; patterning the resist layer to form openings exposing the seed layer; forming metal patterns in the openings; and performing a stripping process with a stripping solution to remove the patterned resist layer, wherein the stripping solution comprises a non-dimethyl sulfoxide solvent and an alkaline compound, the non-dimethyl sulfoxide solvent comprises an aprotic solvent and a protic solvent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing a resist layer, comprising:
forming a patterned mask layer on a material layer; and
applying a stripping solution to the patterned mask layer to dissolve the patterned mask layer without dissolving the material layer, wherein the stripping solution comprises a non-dimethyl sulfoxide solvent and an alkaline compound, wherein the alkaline compound comprises a mixture of potassium hydroxide (KOH) and sodium hydroxide (NaOH).

2. The method according to claim 1, wherein the non-dimethyl sulfoxide solvent comprises N-methylpyrrolidone (NMP), tetrahydrofuran (THF), dimethylformamide (DMF), acetonitrile (MeCN) or dichloromethane (DCM).

3. The method according to claim 1, wherein the non-dimethyl sulfoxide solvent comprises an alkanolamine solvent.

4. The method according to claim 3, wherein the alkanolamine solvent comprises ethanol amine (MEA), methyl ethanol 2-(2-aminoethylamino)ethanol, or diethanolamine.

5. The method according to claim 1, wherein the alkaline compound further comprises tetra-methyl ammonium hydroxide (TMAH).

6. The method according to claim 1, wherein a material of the patterned mask layer comprises an ester group-containing resist material.

7. A method of manufacturing a semiconductor structure, comprising:
forming a seed layer;
forming a patterned resist layer on the seed layer, wherein the patterned resist layer has openings exposing the seed layer;
forming metal patterns in the openings; and
performing a stripping process to the patterned resist layer by applying a stripping solution to break the patterned resist layer into pieces and dissolve the pieces of the patterned resist layer in the stripping solution, wherein the stripping solution comprises a non-dimethyl sulfoxide solvent and an alkaline compound, the non-dimethyl sulfoxide solvent comprises an aprotic solvent and a protic solvent, wherein a ratio of an amount of the aprotic solvent to an amount of the protic solvent ranges from 1:3.5 to 3.5:1, the aprotic solvent comprises N-methylpyrrolidone (NMP), tetrahydrofuran (THF), dimethylformamide (DMF), acetonitrile (MeCN) or dichloromethane (DCM), the protic solvent comprises ethanol amine (MEA), methyl ethanol amine, 2-(2-aminoethylamino)ethanol, or diethanolamine, the alkaline compound comprises tetra-methyl ammonium hydroxide (TMAH), potassium hydroxide (KOH), sodium hydroxide (NaOH) or a combination thereof, and based on a total weight of the stripping solution, an amount of the aprotic solvent is 20 wt % to 70 wt %, an amount of the protic solvent is 20 wt % to 70 wt %, an amount of the alkaline compound is 0.5 wt % to 5.5 wt %, and wherein the alkaline compound comprises a mixture of TMAH and KOH.

8. The method according to claim 7, wherein the metal patterns are formed with a pitch of two adjacent metal patterns in a range of 30 µm to 120 µm.

9. The method according to claim 7, wherein a swelling percentage by volume of the patterned resist layer during the stripping process is approaching 0%.

10. The method according to claim 7, wherein during the stripping process, the alkaline compound permeates into the patterned resist layer to break a crosslinked structure of the patterned resist layer.

11. The method according to claim 7, wherein at least one of the metal patterns is formed with an aspect ratio (height to width) more than 3.

12. A method of manufacturing a semiconductor structure, comprising:
forming conductive through vias on a carrier;
providing a die on the carrier; and
laterally encapsulating the die and the conductive through vias with an encapsulant, wherein forming the conductive through vias on the carrier comprises:
sequentially forming a seed layer and a resist layer on the carrier, wherein a material of the resist layer comprises an ester group-containing resist material;
patterning the resist layer to form openings exposing the seed layer;
forming metal patterns in the openings; and
performing a stripping process with a stripping solution to remove the patterned resist layer, wherein the stripping solution comprises a non-dimethyl sulfoxide solvent and an alkaline compound, the non-dimethyl sulfoxide solvent comprises an aprotic solvent and a protic solvent.

13. The method according to claim 12, wherein the aprotic solvent comprises N-methylpyrrolidone (NMP), tetrahydrofuran (THF), dimethylformamide (DMF), acetonitrile (MeCN) or dichloromethane (DCM), the protic solvent comprises ethanol amine (MEA), methyl ethanol amine, 2-(2-aminoethylamino)ethanol, or diethanolamine, the alkaline compound comprises tetra-methyl ammonium hydroxide (TMAH), potassium hydroxide (KOH) or a combination thereof, and based on a total weight of the stripping solution, an amount of the aprotic solvent is 20 wt % to 70 wt %, an amount of the protic solvent is 20 wt % to 70 wt %, an amount of the alkaline compound is 0.5 wt % to 5.5 wt %.

14. The method according to claim 12, wherein forming the conductive through vias on the carrier further comprises:
after removing the patterned resist layer, removing a portion of the seed layer exposed by the metal patterns.

15. The method according to claim 12, wherein during the stripping process, the stripping solution is applied by immersion.

16. The method according to claim 12, wherein a ratio of an amount of the aprotic solvent to an amount of the protic solvent ranges from 1:3.5 to 3.5:1.

17. The method according to claim 12, wherein at least one of the openings is formed with an aspect ratio more than 3.

18. The method according to claim 12, wherein a process time of the stripping process ranges from 1 minute to 180 minutes, and a process temperature of the stripping process ranges from 25° C. to 100° C.

19. The method according to claim 12, wherein a swelling percentage by volume of the patterned resist layer during the stripping process is approaching 0%.

20. The method according to claim 12, wherein the alkaline compound comprises a mixture of TMAH and KOH.

* * * * *